United States Patent [19]
Terui et al.

[11] Patent Number: 5,903,871
[45] Date of Patent: May 11, 1999

[54] VOICE RECORDING AND/OR REPRODUCING APPARATUS

[75] Inventors: Nobuo Terui; Masatoshi Tobinai, both of Hachioji, Japan

[73] Assignee: Olympus Optical Co., Ltd., Tokyo, Japan

[21] Appl. No.: 08/838,114

[22] Filed: Apr. 15, 1997

[30]       Foreign Application Priority Data

Apr. 22, 1996  [JP]  Japan .................................. 8-100441
May 17, 1996  [JP]  Japan .................................. 8-123697

[51] Int. Cl.[6] .................................. G10L 3/00; G10L 9/00

[52] U.S. Cl. .................................. 704/500; 704/270

[58] Field of Search .................................. 704/270, 500

[56]            References Cited

U.S. PATENT DOCUMENTS 4,260,854   4/1981   Kolodny .................................. 704/270
5,499,316   3/1996   Sudoh et al. .................................. 704/270

*Primary Examiner*—David R. Hudspeth
*Assistant Examiner*—Robert Louis Sax
*Attorney, Agent, or Firm*—Kenyon & Kenyon

[57]            ABSTRACT

A voice recording and/or reproducing apparatus has a memory for storing information unique to a user and/or information unique to the apparatus. When recording a voice file, the unique information is recorded in index information. Preferably, a unique file number is also recorded. In order that a voice file can be recognized by a personal computer or other information apparatus, a predetermined identifier consisting of one to three characters is added to the name of the voice file. When reproducing, a voice file having a name including the predetermined identifier consisting of one to three characters is selected and reproduced.

62 Claims, 19 Drawing Sheets

| VERSION NUMBER OF CONTROL SYSTEM |
|---|
| NAME OF MANUFACTURER |
| MODEL NAME |
| SERIAL NUMBER |
| ⋮ |

Fig. 2

VOICE RECORDING AND/OR REPRODUCING APPARATUS

BACKGROUND OF THE INVENTION

1. Field of the Invention

The present invention relates to a voice recording and/or reproducing apparatus for recording a voice to a recording medium by converting an analog signal representing the voice to a digital signal, and/or for reproducing the voice by converting the digital signal to an analog signal.

2. Description of the Related Art

A digital voice recording and reproducing apparatus converts an analog signal representing a voice to a digital signal and records the digital signal in a recording medium when the voice is recorded, and converts the digital signal to an analog signal when the voice is reproduced. Various types of digital voice recording and reproducing apparatuses have been developed and practically used.

The digital voice recording and reproducing apparatus has been practically used also in a so-called dictation system in which the dictations recorded by a plurality of dictators are reproduced and typed by a typist, or in a so-called centralized type of dictation system in which a dictation is directly recorded by a dictator via a telephone network or the like to a reproducing apparatus located on the side of a typist.

In the dictation system, in order to identify the dictator of a dictation, the dictator's name is inputted as voice at the beginning of the dictation. In the centralized type of dictation system, a predetermined number assigned to the dictator is inputted before the dictation is started by using the telephone.

However, it is troublesome to input the dictator's name as voice each time recording is made. Further, measures should be taken against the case in which a plurality of dictators have the same name.

Moreover, the digitally recorded dictation is often recorded in a rewritable solid-state memory, which may be used for a recording medium of a computer. It is very convenient if a single solid-state memory is commonly used for the voice recording and reproducing apparatus and the computer. However, in such a case, a recorded voice file is required to be discriminated from the other computer files to prevent confusion.

SUMMARY OF THE INVENTION

It is an object of the present invention to provide a voice recording and/or reproducing apparatus which can easily discriminate and manage a voice file.

In one aspect of the present invention, information unique to a voice recording and/or reproducing apparatus is stored in the body of the apparatus and the information is copied to an index portion of a voice file. In another aspect of the present invention, the name of a voice file includes an identifier consisting of one to three characters.

Other and further objects, features and advantages of the invention will appear more fully from the following description.

BRIEF DESCRIPTION OF THE DRAWINGS

The accompanying drawings are for the purpose of illustration only and not for limitation.

FIG. 2 is an illustration of an example of information stored in a fixed information storing portion of the voice recording and reproducing apparatus of the first embodiment of the present invention.

DESCRIPTION OF THE PREFERRED EMBODIMENTS

The present invention will be described in further detail by way of example with reference to the accompanying drawings.

Figure 1:
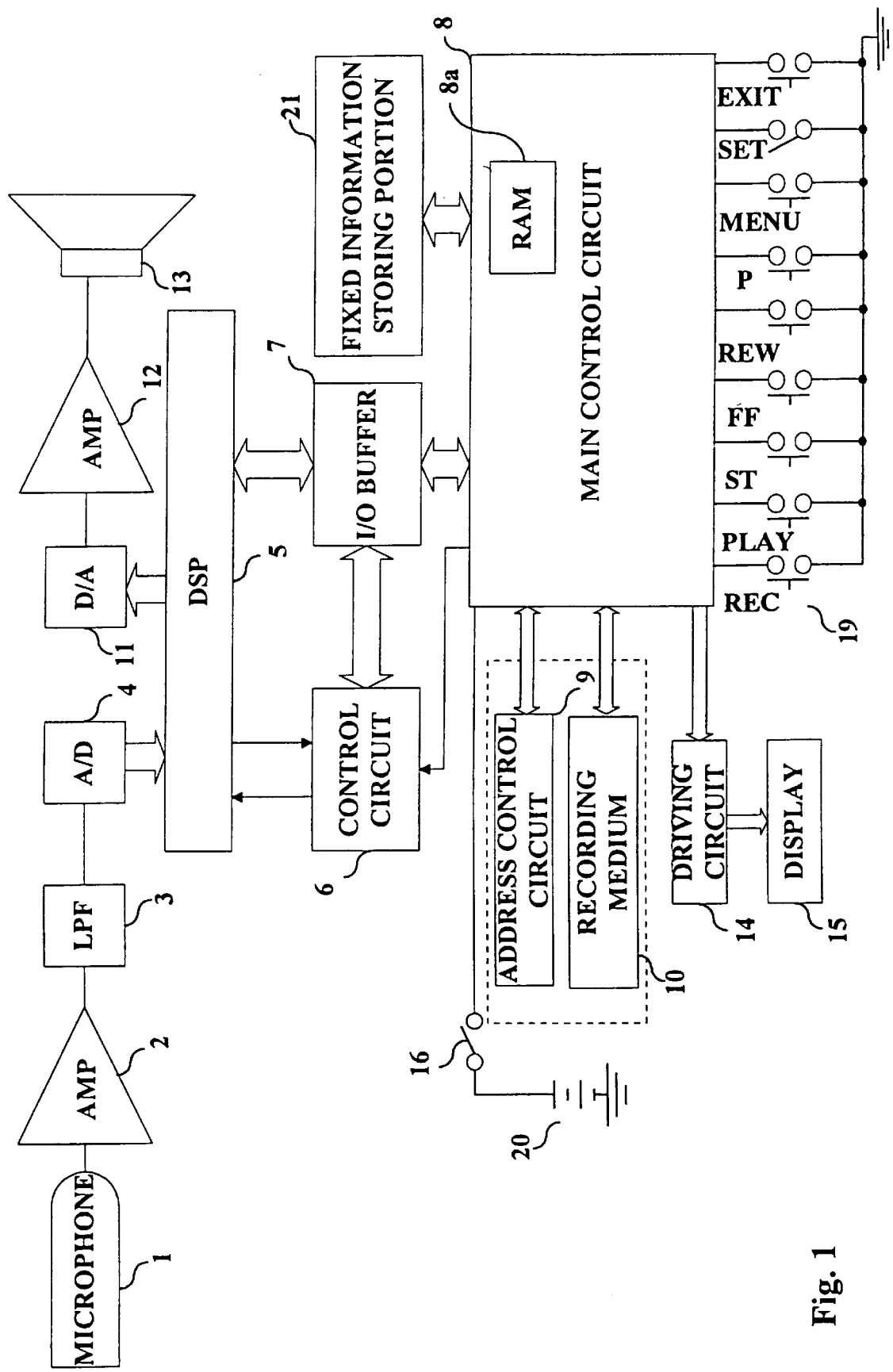
FIG. 1 is a block diagram showing the structure of a voice recording and reproducing apparatus of a first embodiment of the present invention.

FIG. 1 is a block diagram of the structure of a voice recording and reproducing apparatus of a first embodiment of the present invention.

The voice recording and reproducing apparatus of the first embodiment comprises a microphone 1 for converting a voice to an analog electrical signal. A pre-amplifier 2 connected to the microphone 1 amplifies the analog signal. An unnecessary frequency band is cut off from the amplified analog signal by a low-pass filter 3 to prevent aliasing noises from being generated, and the analog signal is converted to a digital signal by an analog-to-digital converter (hereinafter called "A/D converter") 4.

The digital signal is inputted to a digital signal processor (hereinafter called "DSP") 5.

The DSP 5 is coupled to a control circuit 6 for controlling operations of the DSP 5, as well as to an input-output buffer (hereinafter called "I/O buffer") 7 as a buffer means for temporally storing coded data. The control circuit 6 is coupled to a main control circuit 8 described below, and is controlled thereby.

Further, a battery 20 for supplying electric power to the whole voice recording and reproducing apparatus supplies an operating voltage to the DSP 5 via a main power switch 16.

When recording, the DSP 5 is controlled by the control circuit 6 so that the digital signal from the A/D converter 4 is compressively transformed (coded) to data in a predetermined format. The coded data are temporally stored in the I/O buffer 7, and then transmitted to the main control circuit 8.

On the other hand, when reproducing, the DSP 5 is controlled by the control circuit 6 to decompressively transform (decode) the data from the main control circuit 8. The decoded digital signal is inputted to a digital-to-analog converter (hereinafter called "D/A converter") 11.

The D/A converter 11 converts the decoded digital signal to an analog signal, and the analog signal is inputted to a power amplifier 12 for amplifying the analog signal and driving a speaker 13 via a low-pass filter (not shown) for cutting off an unnecessary frequency band from the analog signal to reduce quantization noises. The speaker 13 converts the analog signal to a voice.

The main control circuit 8 comprises a micro-processor as a central processing unit (CPU), and serves as a control means for controlling the operations of respective portions of the voice recording and reproducing apparatus. Further, the main control circuit 8 is an element of a data recording means for controlling the reading and writing of predetermined index information, and of a file number generating means for generating a file number as a source of the index information.

That is, the main control circuit 8 is coupled to a fixed information storing portion 21 in which information unique to the voice recording and reproducing apparatus is stored before the voice recording and reproducing apparatus is shipped. The main control circuit 8 controls the reading of the fixed information out of the fixed information storing portion 21, and the writing of the fixed information, directly or after being properly processed, into a recording medium 10 comprising an IC memory detachably coupled to or included within the voice recording and reproducing apparatus.

When a user identification is set by the user for himself or herself, the main control circuit 8 implements the same steps as described above, based on information not from the fixed information storing portion 21 but from a random access memory (herein after called "RAM") 8a in the main control circuit 8. The details of the implementation of the process will be described below.

Although, in the first embodiment, the fixed information storing portion 21 is an external recording medium, e.g., a read only memory (herein after called "ROM"), coupled to the main control circuit 8, it is not limited to this specific form. For example, the fixed information storing portion 21 may be an electrically writable nonvolatile memory in the main control circuit 8.

FIG. 2 illustrates an example of information stored in the fixed information storing portion 21.

As described above, the fixed information is stored in the fixed information storing portion 21 of the voice recording and reproducing apparatus before the apparatus is shipped. The stored information includes the version number (Ver No.) of the control system, the name of the manufacturer, the model name, the serial number (e.g., 0013527 shown in FIG. 2) or the like, of the apparatus.

In the first embodiment, the fixed information storing portion 21 is the external ROM coupled to the main control circuit 8. However, since some of the fixed information, such as the version number of the control system, the name of the manufacturer, the model name or the like, will be determined in the phase of product design, they may be stored as software in a ROM in the main control circuit 8. The serial number may be written into a nonvolatile memory included within or externally coupled to the control circuit 8, while the apparatus is produced or assembled.

Further, the information can be stored in any kinds of data storing devices from which the stored information can be read, e.g., the DSP 5, the control circuit 6, the recording medium 10 or the like.

The control relating to the index information by the main control circuit 8 is implemented in accordance with the operation of an operating portion 19 comprising a plurality of operation buttons and switches. That is, the information reading or writing as described above, or the like operation is implemented by the operation of a corresponding operation button or switch of the operating portion 19. Thus, the main control unit 8 controls the operation of the fixed information storing portion 21, the RAM 8a, an address control circuit 9, and the recording medium 10, as well as the operation of the DSP 5.

As described above, the I/O buffer 7 is coupled to the main control circuit 8. Data from the DSP 5 is inputted to the main control unit 8 via the I/O buffer 7.

The recording medium 10 and the address control circuit 9 are coupled to the main control circuit 8. The main control circuit 8 provides an appropriate address signal to the address control circuit 9 in accordance with the operation of the operating portion 19, records in the recording medium 10 in a predetermined format the voice date from the I/O buffer 7, and the index information based on a recording date and the information from the fixed information storing portion 21 and the RAM 8a, or reads out the data from the recording medium 10 to provide it to the DSP 5 through the I/O buffer 7.

The recording medium 10 as an IC memory includes a temporal recording medium portion and a main recording medium portion. The temporal recording medium portion adopts a static random access memory (hereinafter called "SRAM"), an electrically erasable and programmable read only memory (EEPROM), a high-dielectric memory, a flash memory, or the like, which the data can be read from and written in at a higher speed than the main recording medium portion. The main recording medium portion uses a flash memory, a magneto-optical disc, a magnetic disc, magnetic tape, or the like. In the voice recording and reproducing apparatus of the first embodiment, the SRAM is adopted for the temporal recording medium portion, and the flash memory is adopted for the main recording medium portion.

The address indicating the recording position of voice information may be stored in the recording medium 10 as the IC memory detachably coupled to the main control circuit 8 or an internal recording medium (not shown) as an IC memory associated with the address control circuit 9 located in the recording and reproducing apparatus.

The main control circuit 8 is coupled to the operating portion 19 as described above, and further via a driving circuit 14 to a display 15 for displaying an operation mode, a state of user identification setting, or the like.

The operating portion 19 includes various kinds of operation buttons, i.e., a voice recording button REC, a playing button PL, a stop button ST, a fast forwarding button FF, a fast returning button REW, a priority setting button P, a menu button MENU for setting a menu mode for selecting a function in a menu, a set button SET for setting the selected function, an exit button EXIT for exiting from the menu mode, a button (not shown) for deleting voice data, an I mark button (not shown) for recording a predetermined index mark, an E mark button (not shown), and the like.

Figure 3:
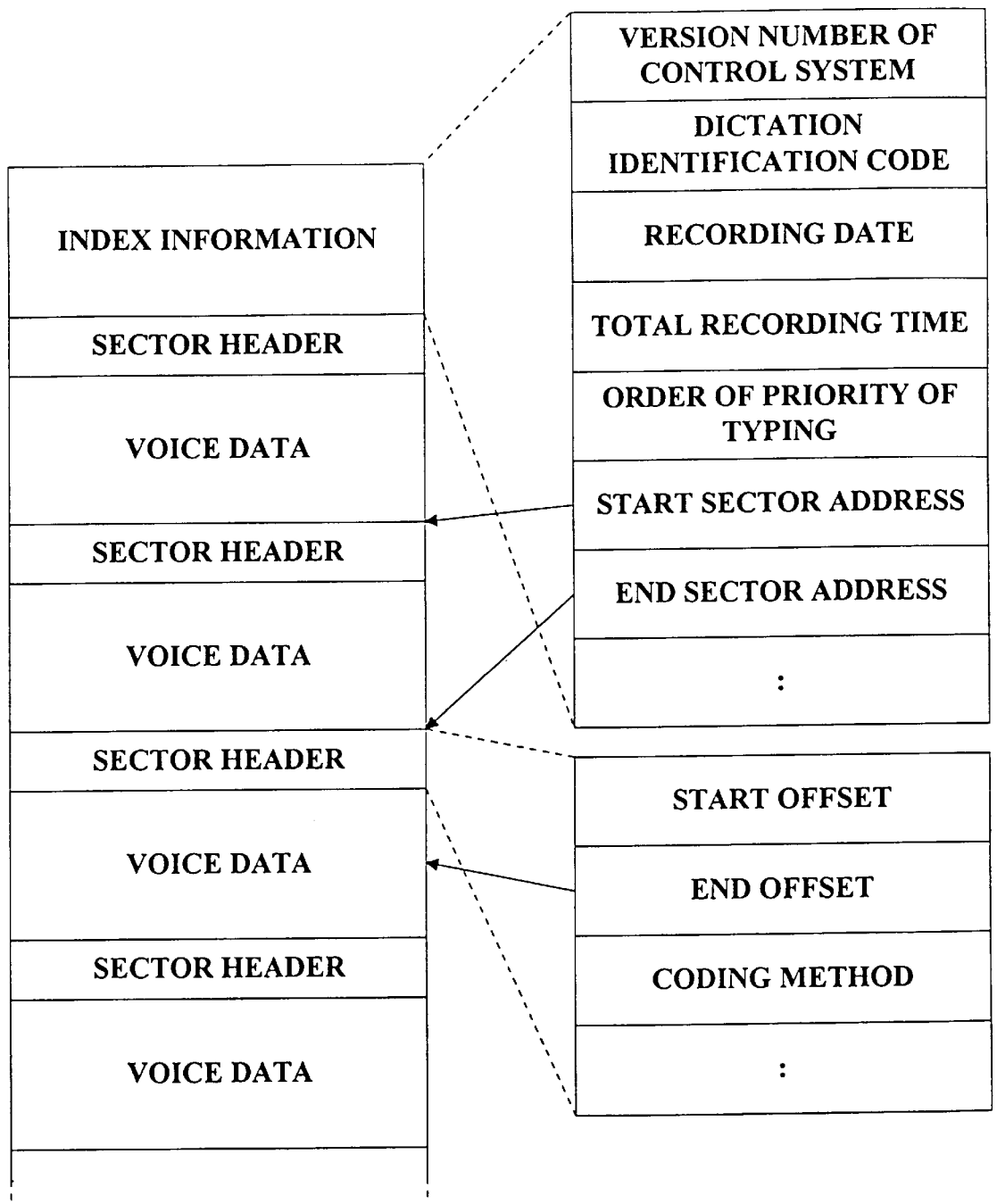
FIG. 3 is an illustration of an example of a map of data recorded in a recording medium for recording index information, voice data and the like, by the voice recording and reproducing apparatus of the first embodiment of the present invention.

FIG. 3 illustrates an example of a map of data recorded in a recording medium for recording the index information, voice data or the like, by the voice recording and reproducing apparatus of the first embodiment of the present invention.

One of the main functions of the voice recording and reproducing apparatus of the first embodiment is voice data recording by the dictation system. When recording by the dictation system, a dictation record is recorded as a file comprising a plurality of sectors in the recording medium 10 under the control of the main control circuit 8. At this time, as shown in FIG. 3, information relating to the dictation is recorded as the index information in the first sector of the area corresponding to the dictation.

In the first embodiment, the index information includes the version number of the control system read out from the fixed information storing portion 21, a dictation identification code generated by the control circuit 8 for identifying the dictation, the recording date of the dictation, total recording time, the order of priority of typing, and the like. The order of priority can be set by the user pressing the priority setting button P.

When the data are transmitted to a reproducing apparatus (not shown) of the typist, the above information is read out first to help the typist's operation and indicate the sectors in which the voice data are recorded. A method of generating the dictation identification code will be described below.

Further, the index information includes start sector addresses, end sector addresses, and the like. The index information is followed by sector headers paired with respective voice data areas to form the data for the dictation corresponding to the index information. The sector headers are pointed by the start sector addresses and include start offsets, end offsets, methods of coding the record, and the like.

Figure 4:
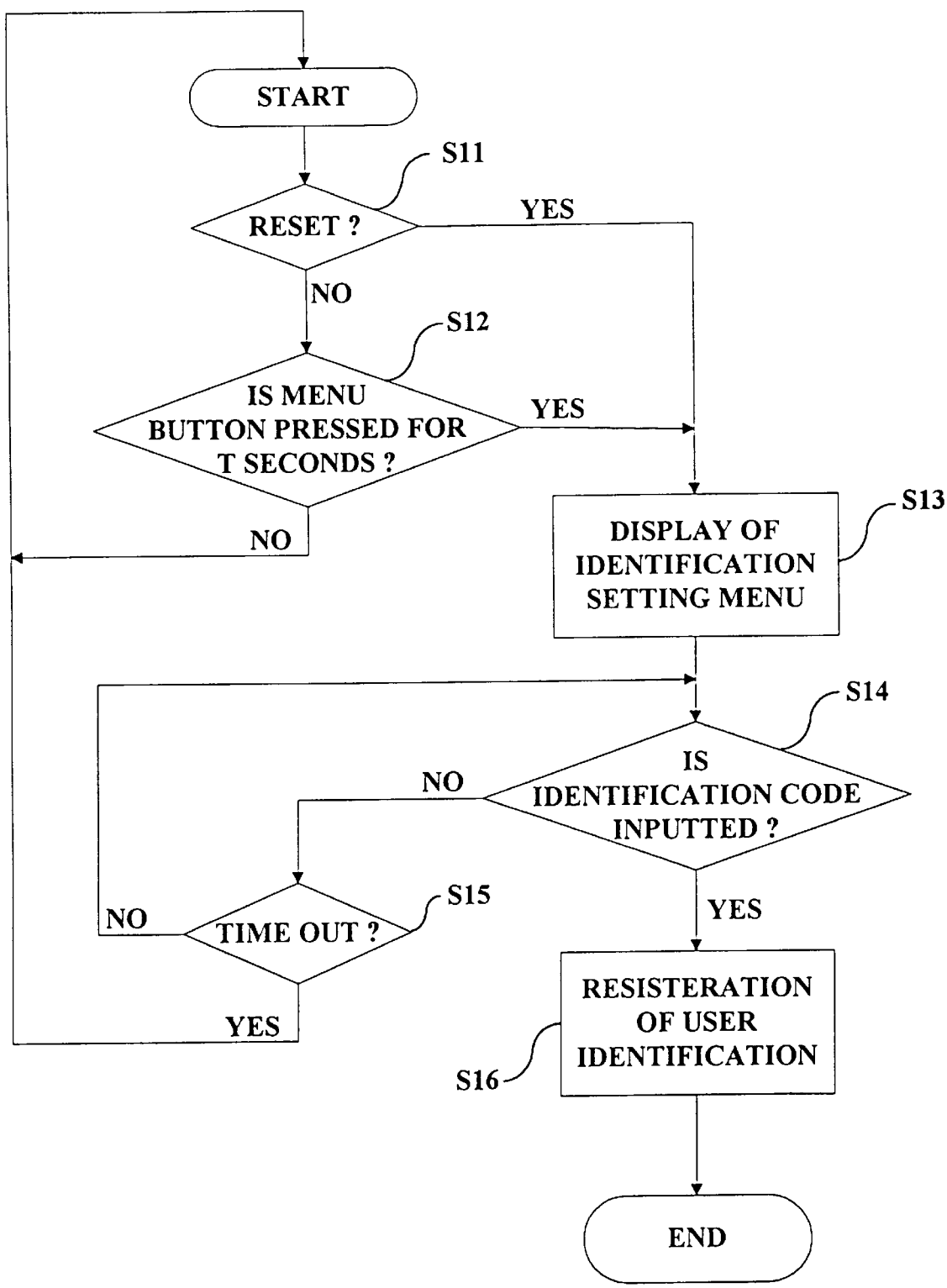
FIG. 4 is a flowchart of setting a user identification in the voice recording and reproducing apparatus of the first embodiment of the present invention.
Figure 5:
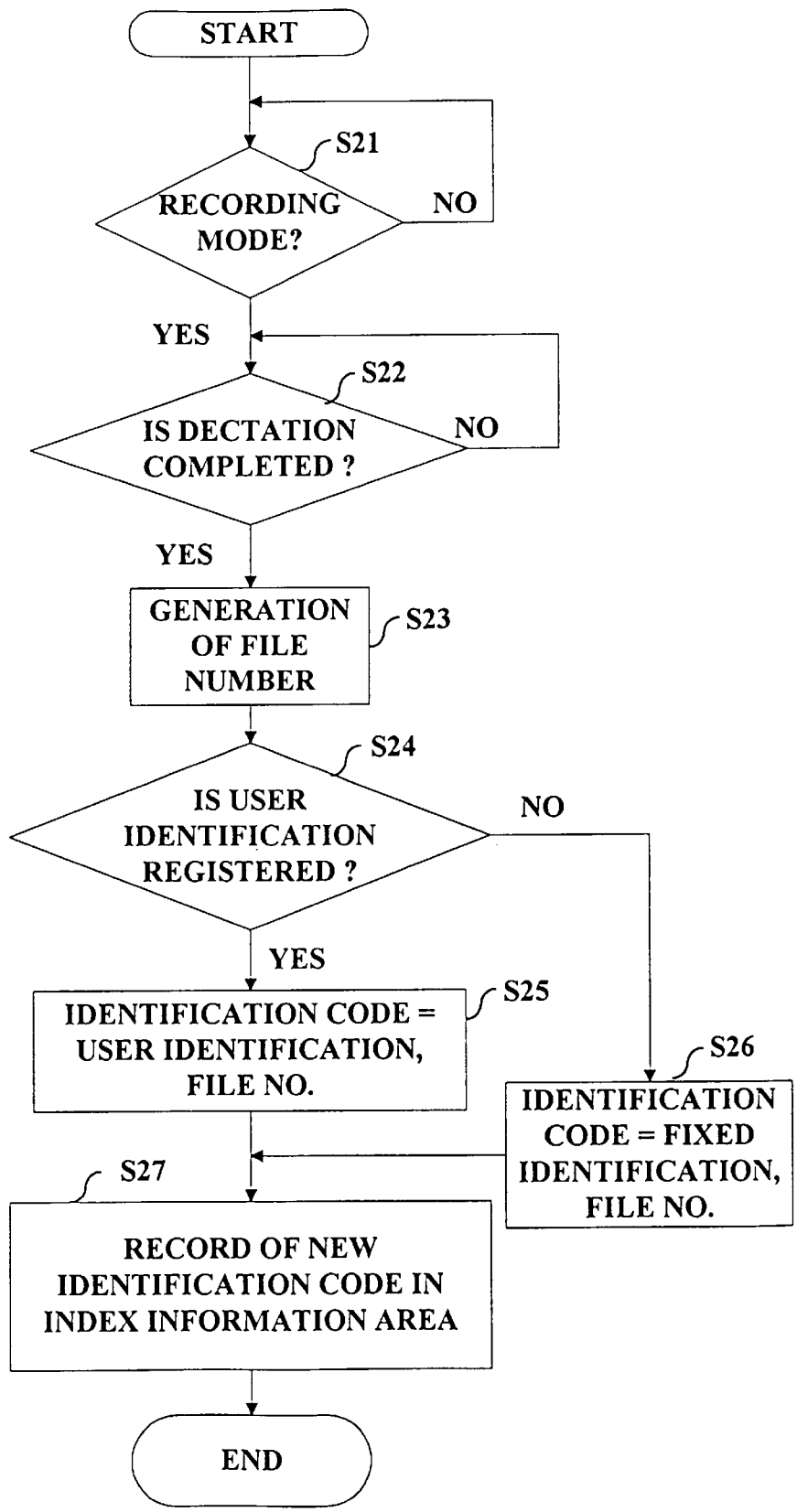
FIG. 5 is a flowchart of recording an identification code as index information in the voice recording and reproducing apparatus of the first embodiment of the present invention.

Referring to the flowcharts of FIGS. 4 and 5, a method of generating the dictation identification code in the voice recording and reproducing apparatus of the first embodiment will now be described.

In the voice recording and reproducing apparatus of the first embodiment, the user can set a user identification for himself or herself. When the user identification is set, the main control circuit 8 generates the dictation identification code based on the user identification and records it as the index information.

Accordingly, referring to FIG. 4, a method of setting the user identification will be described.

In step S11, the main control circuit 8 determines whether the control system has been reset due to the system having been down or the like. If the system has been reset, the display 15 automatically displays an identification setting menu in step S13 to invite the user to set his or her identification code. If it is not necessary to identify the user since, for example, the voice recording and reproducing apparatus is personally used, the identification code is not set if the user makes no input operation.

If it is determined in step S11 that the system has not been reset, the process goes to step S12, in which it is determined whether the menu button MENU for setting operating conditions of the voice recording and reproducing apparatus has been pressed for a predetermined time period (t seconds) or not. If the menu button MENU has been pressed for the predetermined time period, it is recognized that the user has the intention to set the user identification, and the process goes to step S13, in which the identification setting menu is displayed on the display 15 so that the user identification can be set.

Next, in step S14, the user inputs a predetermined identification code consisting of, for example, four characters by pressing a predetermined button located in the operating portion 19. In the first embodiment, the identification code is a predetermined combination of four alphanumeric characters comprising Arabic numerals, Latin alphabets or the like. The four alphanumeric characters are selected by the predetermined button, e.g., the button SET for setting a selected function, to set the identification code. The setting button is not limited to the button SET. Another button or a plurality of buttons may be used.

If the user identification is not set within a predetermined time period (step S15), the process goes back to step S11 with no user identification set.

If the user identification is inputted in step S14, the process goes to step S16, in which the main control circuit 8 stores the identification code in the RAM 8a within the main control circuit 8. Thus, the user identification is registered.

The menu selecting button will now be described.

Especially a portable digital recorder such as the voice receding and reproducing apparatus of the first embodiment is required to perform many operating functions with a small number of buttons. Accordingly, it is common to use a combination of a plurality of buttons, such as the menu button MENU, the button SET for setting the selected function, the button EXIT for exiting from the menu mode, or the like, to set various functions, such as adjusting the sensitivity of a microphone, setting a voice actuated recording mode, changing a bit rate, selecting a coding method, or the like. These functions are normally selected from those which are not often used.

The function for setting the user identification code in the voice recording and reproducing apparatus of the first embodiment is less used than the above functions. Once the function is used, it will seldom be used again.

In the first embodiment, considering this situation, it is designed that the identification setting mode can be established only when the menu button MENU has been pressed for a predetermined time period, which is different from the usual menu operation.

Next, referring to a flowchart of FIG. 5, a method of recording the identification code as the index information in the voice recording and reproducing apparatus of the first embodiment will be described.

In step S21, the main control circuit 8 determines whether the apparatus is in a recording mode or not. If it is determined that the apparatus is in the recording mode, the process goes to step S22, in which the main control circuit 8 determines whether the recording of one dictation has been completed or not. The completion of the recording does not mean a mere pause mode, but means that an operation for ending the recording of one dictation has been effectuated, for example, by pushing the E mark button. If it is determined in step S21 that the apparatus is not in the recording mode, the process waits until the apparatus is in the recording mode.

If it is determined in step S22 that the recording has been completed, the process goes to step S23, in which the main control circuit 8 generates a four-digit number (e.g., 1234) as a file number corresponding to the one dictation. If a plurality of files are created, consecutive file numbers are given to them. Each file number is unique to the corresponding dictation. The file numbers are not limited to consecutive numbers and may be random numbers. Further, the file numbers are not limited to four-digit numbers, and any kinds of alphanumeric characters may be used. If the recording has not been completed in step S22, the process waits for its completion.

In step S24, the main control circuit 8 determines whether the user identification has been registered in the RAM 8a within the main control circuit 8 or not. If the user identification has been registered, the process goes to step S25, in which based on the user identification and the file number, a new identification code for the dictation file is generated. In the first embodiment, for example, four alphanumeric characters (e.g., ABCD) registered as the user identification are combined with a four-digit file number (e.g., 1234) to be the new identification (e.g., ABCD1234). In step S27, the new identification is recorded in the index information area of the recording medium 10. Thus, a unique identification code (dictation identification code) is assigned to each dictation in the recording medium 10.

If it is determined in step S24 that the user identification has not been registered, the process goes to step S26, in which the main control circuit 8 reads from the fixed information storing portion 21 some parts of fixed information, for example, the first two characters (e.g., XY) of the name of the manufacturer and the last two figures (e.g., 27) of the serial number, which are then combined with the four-digit file number (e.g., 1234) to be a new identification code (e.g., XY271234). The new identification code is recorded in the index information area of the recording medium 10 in the same way as described above.

Thus, in the voice recording and reproducing apparatus of the first embodiment, whenever a voice is recorded in the IC memory, identification information unique to the user or the apparatus is recorded in the index information assigned to each dictation. Accordingly, it is not necessary to tell the name of the dictator.

Further, since the identification information is combined with a file number given to each dictation to be recorded, the dictator and the dictation can be identified by a single identification code. Hence, when the recorded dictation data are transferred to, for example, a personal computer, the data can be managed only by the information in the file.

Referring to FIGS. 6–16, a voice recording and reproducing apparatus of a second embodiment of the present invention will now be described.

Figure 7:
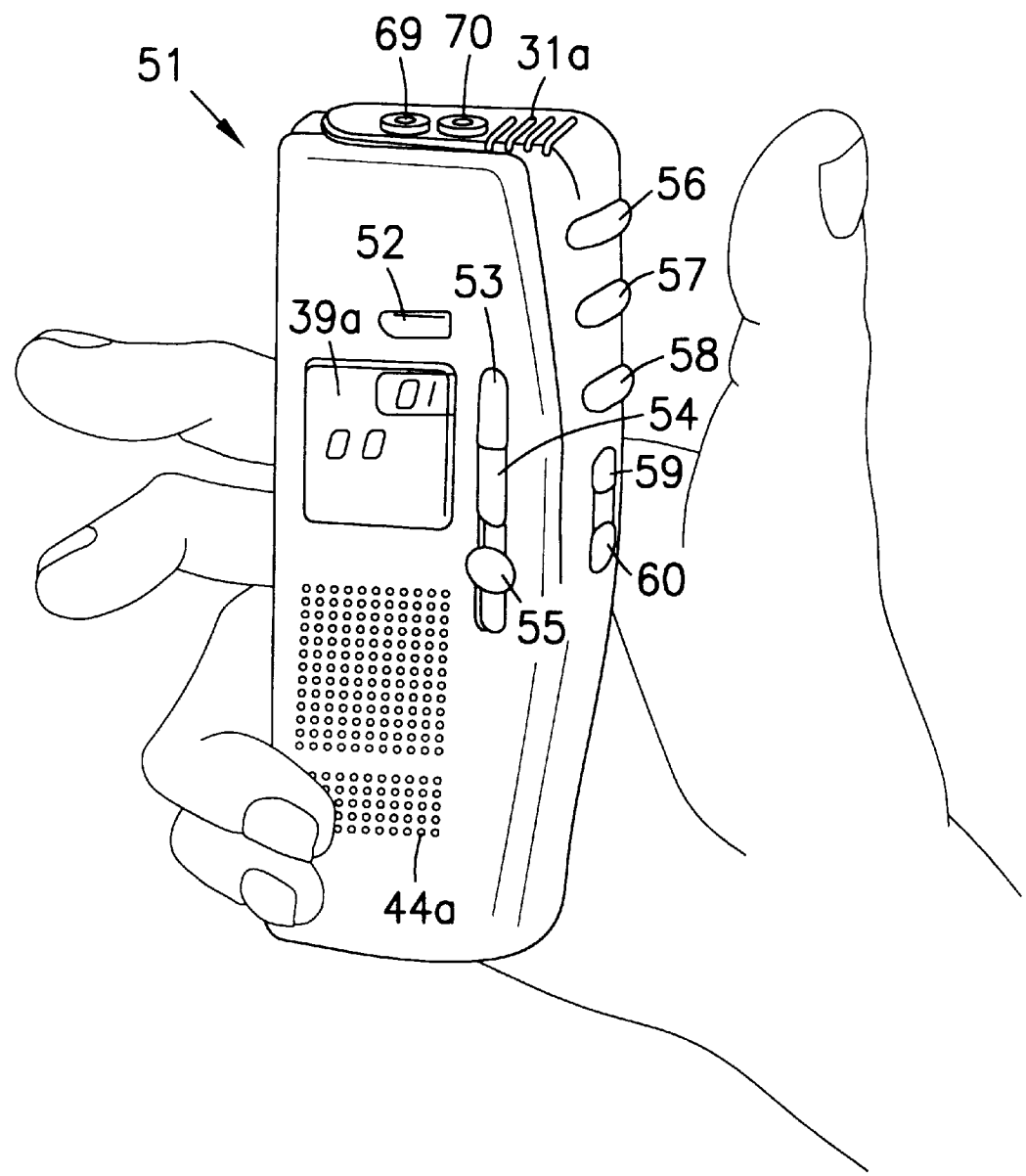
FIG. 7 is a perspective view of the voice recording and reproducing apparatus of the second embodiment of the present invention.
Figure 8:
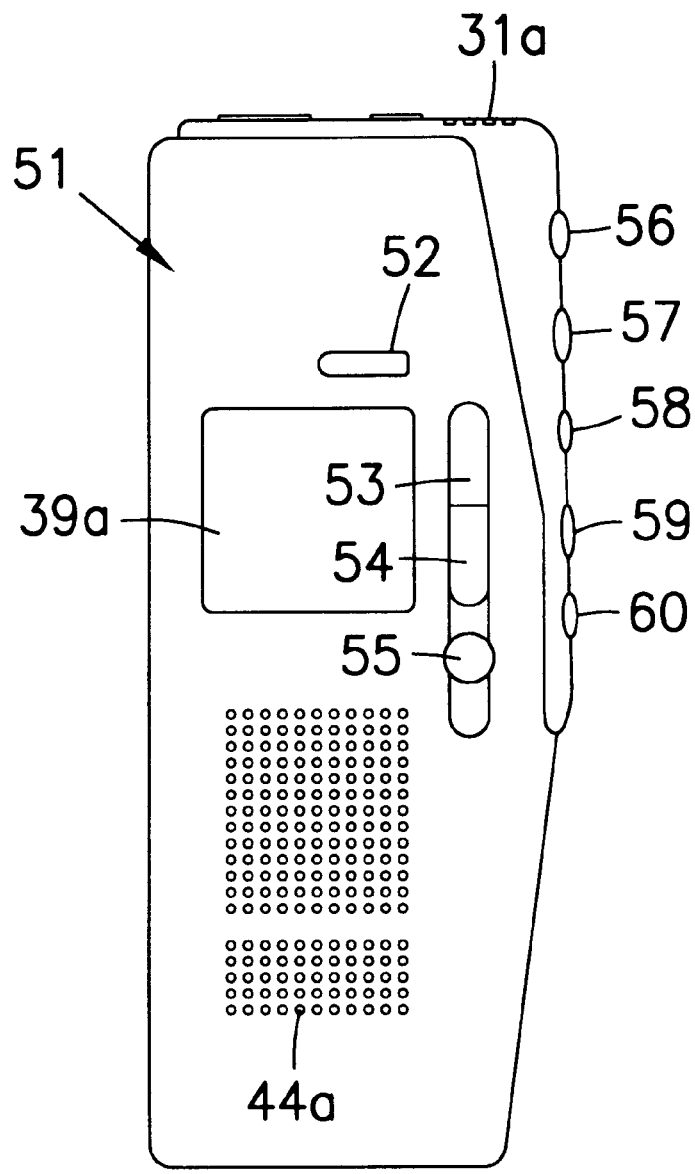
FIG. 8 is an elevation view of an arrangement of operation buttons of the voice recording and reproducing apparatus of the second embodiment of the present invention.

FIG. 7 is a perspective view of the voice recording and reproducing apparatus, and FIGS. 8–11 are an elevation view, a right side view, a left side view, and a plane view, respectively, showing an arrangement of operation buttons and switches on the voice recording and reproducing apparatus.

A voice recording and reproducing apparatus 51 can be used as a voice recording apparatus and a voice reproducing apparatus and has a shape designed to be easily held by a hand, as can be appreciated from FIG. 7. The voice recording and reproducing apparatus 51 is provided approximately at the center of its front portion with a liquid crystal display (hereinafter called "LCD") 39a for displaying various kinds of information. Under the LCD 39a is a speaker portion 44a incorporating a speaker 44 described below. Above the LCD 39a is an erasing button 52 corresponding to an erasing button ERASE described below. On the right side of the LCD 39a are, in the order from the upper side to the lower side, an up button 53, a down button 54, and a menu button 55 respectively corresponding to an up button UP, a down button DOWN, and a menu button MENU which are described below.

Figure 9:
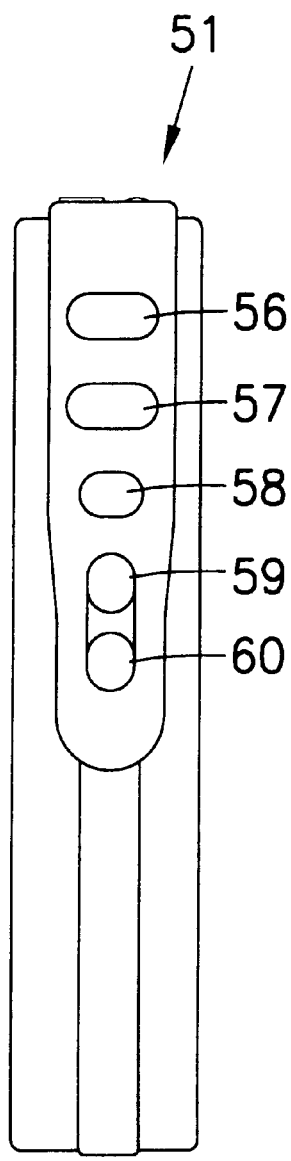
FIG. 9 is a right side view of the arrangement of the operation buttons of the voice recording and reproducing apparatus of the second embodiment of the present invention.

As shown in FIG. 9, the right side of the voice recording and reproducing apparatus 51 comprises, in the order from the upper side to the lower side, a voice recording button 56, a stop button 57, a playing button 58, a fast returning button 59, and a fast forwarding button 60 respectively corresponding to a voice recording button REC, a stop button STOP, a playing button PLAY, a fast returning button REW, and a fast forwarding button FF which are described below.

Figure 10:
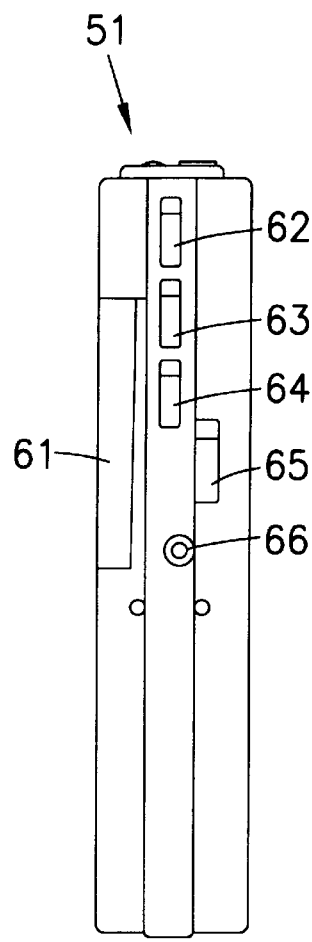
FIG. 10 is a left side view of the arrangement of the operation buttons of the voice recording and reproducing apparatus of the second embodiment of the present invention.

As shown in FIG. 10, the left side of the voice recording and reproducing apparatus 51 comprises, in the order from the lower side to the upper side, a voice actuated recording mode setting button 62, a coding mode changing button 63, and a hold mode setting button 64 respectively corresponding to a voice actuated recording mode setting switch VCVA, a coding mode changing switch RATE, and a hold mode setting switch HOLD which are described below. Under the hold mode setting button 64 are an ejecting button 65 for ejecting a flash memory card 38 as a recording medium described below, and an input portion 66 for inputting a direct current from an external power source. Further, there is a lid member 61 which is opened and closed by the ejecting button 65 to install and remove the flash memory card 38.

Figure 11:
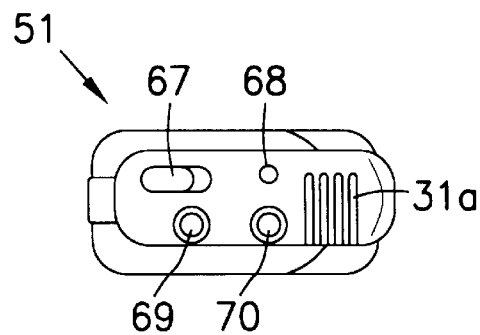
FIG. 11 is a plane view of the arrangement of the operation buttons of the voice recording and reproducing apparatus of the second embodiment of the present invention.

As shown in FIG. 11, the top side of the voice recording and reproducing apparatus 51 comprises an I mark button 67 corresponding to an I mark button I described below; a light-emitting diode (LED) 68 for indicating by emitting light that the voice recording and reproducing apparatus 51 is in the voice recording mode; an earphone jack 69; a microphone/remote jack 70 for coupling an externally located microphone or the like; and a microphone portion 31a incorporating a microphone 31 described below.

The voice recording and reproducing apparatus 51 designed as shown in the drawings is compact and portable. In addition, it is easy to hold and operate.

Figure 6:
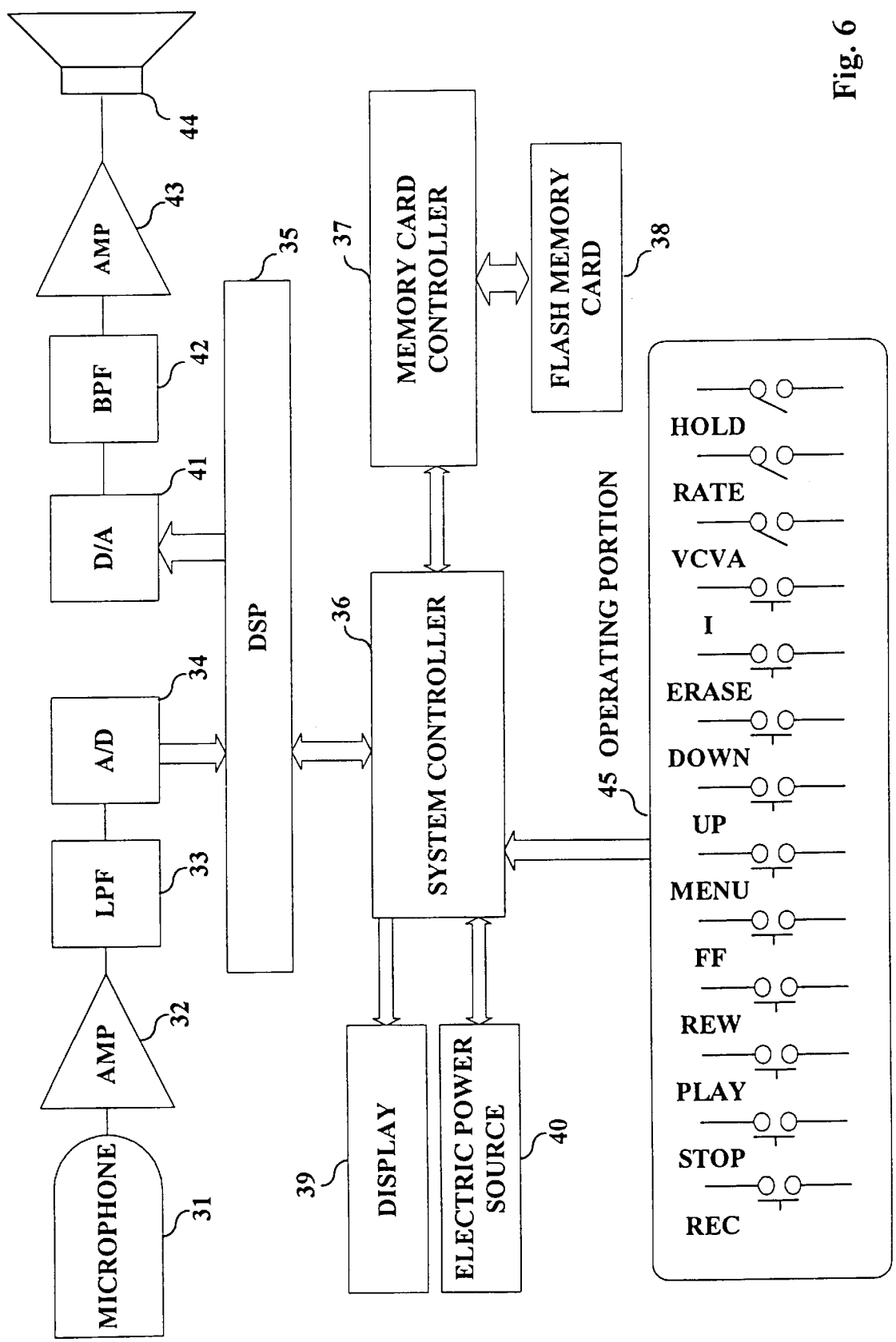
FIG. 6 is a block diagram showing the structure of a voice recording and reproducing apparatus of a second embodiment of the present invention.

Next, FIG. 6 is a block diagram showing the structure of the voice recording and reproducing apparatus 51.

This voice recording and reproducing apparatus 51 comprises the microphone 31 for converting a voice to an analog electric signal. An amplifier 32 amplifies the analog signal transmitted from the microphone 31. A low-pass filter 33 passes only a predetermined low frequency band of the amplified analog signal transmitted from the amplifier 32. An A/D converter 34 converts the analog signal filtered through the low-pass filter 33 to a digital signal. A DSP 35 functions as a data compression means for compressing the digital signal when recording, and as a data decompression means for decompressing the digital signal when reproducing. A system controller 36 performs, in response to the operations of below-mentioned operating buttons and switches, the control of the whole system including the control of the operations of the DSP 35, a memory card controller 37, and a flash memory card 38. The system controller 36 is an element of a file creating means, a file selecting means, an index information recording means, an index information reading means, and a file identification detecting means. The memory card controller 37 functioning as a memory card controlling means controls the flash memory card 38 when a proper address signal is supplied from the system controller 36, to record, in a predetermined format, voice data supplied from the DSP 35 through the system controller 36, or read out the recorded data and supply it to the DSP 35 through the system controller 36. The flash memory card 38 is used as a recording medium, which is, for example, an IC memory. The flash memory card 38 is detachably installed in the voice recording and reproducing apparatus 51 and coupled to the memory card controller 37. A D/A converter 41 converts to an analog signal the digital signal read out from the flash memory card 38 and decompressed by the DSP 35. A band-pass filter 42 cuts off an unnecessary frequency band of the analog signal outputted from the D/A converter 41. An amplifier 43 amplifies the analog signal filtered through the band-pass filter 42. The speaker 44 converts to a voice the amplified analog signal outputted from the amplifier 43. A display 39 displays information, such as an operation mode, a file number or the like, under the control of the system controller 36. An electric power source 40 supplies electric power to the voice recording and reproducing apparatus 51 under the control of the system controller 36. An operating portion 45 is coupled to the system controller 36.

The operating portion 45 comprises the voice recording button REC for starting the voice recording; the stop button STOP for stopping the voice recording, reproducing or the like; the playing button PLAY for starting the voice reproducing; the fast returning button REW for returning the position of the voice recording or reproducing; the fast forwarding button FF for fast forwarding the position of the voice recording or reproducing; the menu button MENU for selecting an optional function in a menu; the up button UP; the down button DOWN; the erasing button ERASE for erasing recorded voice data; and the I mark button I for recording an instruction mark as an index mark for indicating the beginning of a dictation file. The operating portion 45 also comprises the voice actuated recording mode setting switch VCVA for recording only a voice portion to the recording medium by eliminating an unvoice portion; the coding mode changing switch RATE for changing over a data compression method and a bit rate; and the hold mode setting switch HOLD for preventing the buttons from being erroneously operated when no operation is necessary.

Figure 12:
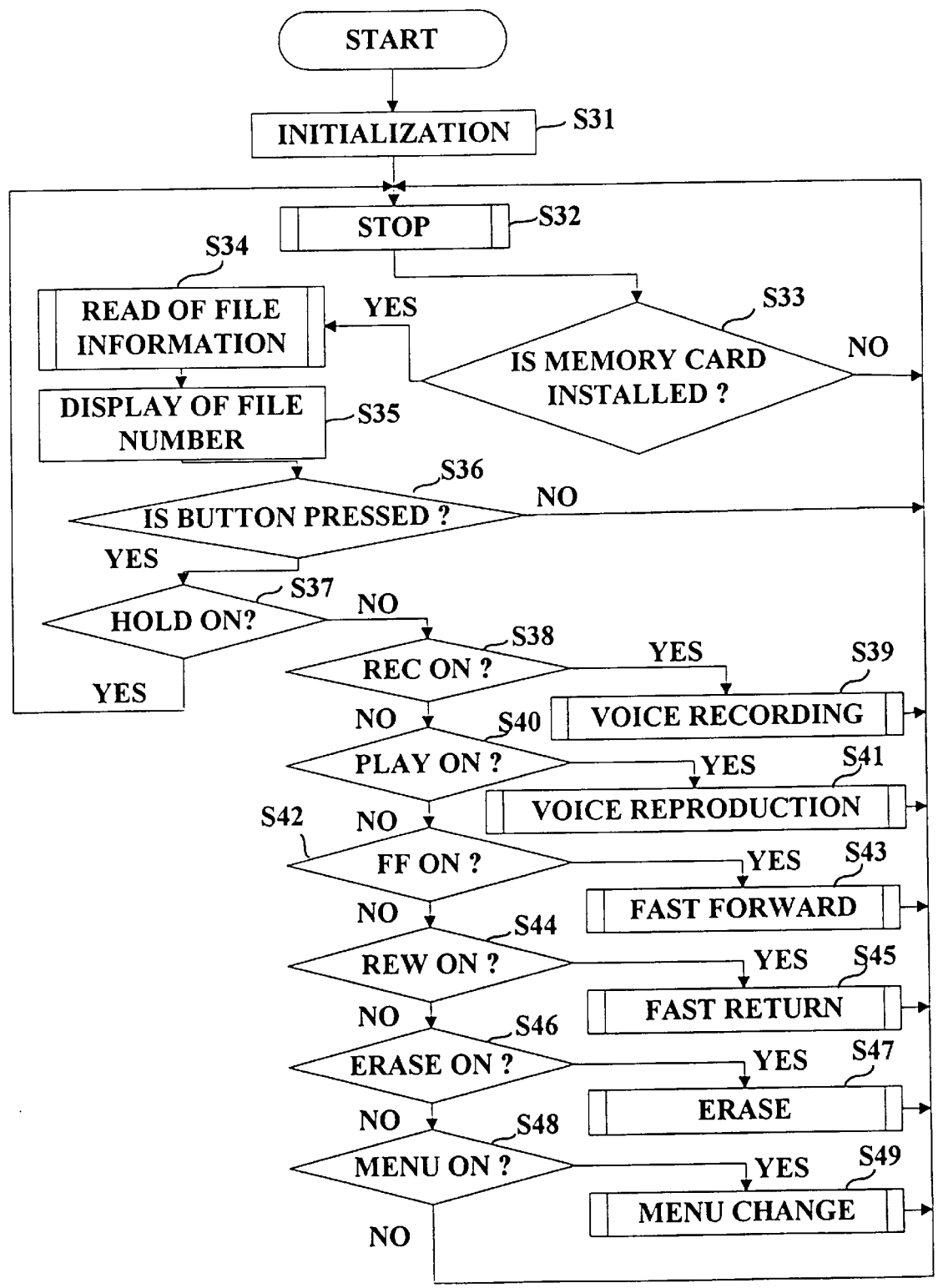
FIG. 12 is a flowchart of an operation of a system controller of the voice recording and reproducing apparatus of the second embodiment of the present invention.

Next, the operation of the voice recording and reproducing apparatus 51 will be described below. FIG. 12 is a flowchart of an operation of the system controller 36.

When the electric power is supplied from the electric power source 40 to the system controller 36, the system controller 36 starts the operation shown in FIG. 12.

In step S31, external conditions and an internal memory of the system controller 36 are initialized and the completion of the initialization is displayed on the display 39.

After the initialization is completed, the operation of the voice recording and reproducing apparatus 51 is stopped in step S32. In step S33, it is determined whether the flash memory card 38 has been installed or not.

If the flash memory card 38 has not been installed, the process goes back to step S32. If the flash memory card 38 has been installed, the process goes to step S34, in which the file information recorded therein is read out. In step S35, voice files only are counted and their number is displayed on the display 39.

In order that a file is judged to be a voice file, the following three conditions must be satisfied:
1. The file name has an extension "dss;"
2. A file discrimination signal "dss" is written at a predetermined position in an index information area in which the index information of the file is recorded; and
3. A file number (0001 to 9999) is written at a predetermined position in the index information area.

Although "dss" is used as the extension of the file name and the file discrimination signal, "dds" also may be used. Further, if "dss" and "dds" are defined by the American Standard Code for Information Interchange (ASCII), it is good for interchangeability.

Figure 13:
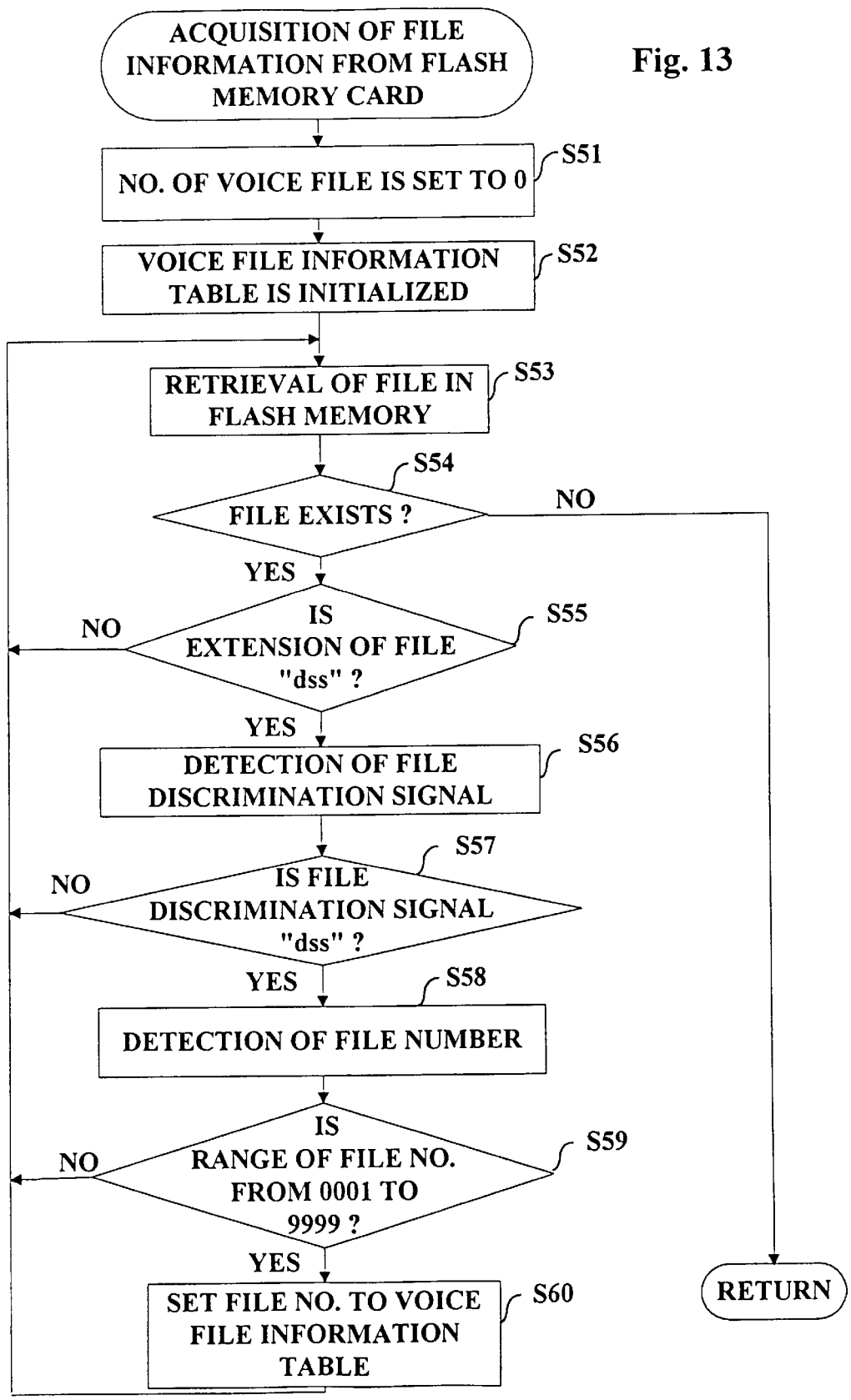
FIG. 13 is a flowchart of acquiring file information from a card in the voice recording and reproducing apparatus of the second embodiment of the present invention.

Referring to FIG. 13, the operation of judging the above-mentioned three conditions will now be described. FIG. 13 is a flowchart of acquiring file information from the flash memory card 38.

When the operation is started, in step S51, the number of voice files is set to zero. In step S52, a voice file information table is initialized.

Next, in step S53, a file in the flash memory is retrieved. In step S54, it is determined whether a file exists or not. If no file exists, the process is ended.

If a file exists, in step S55, it is determined whether the extension of the file is "dss" or not. If the extension of the file is not "dss" the process goes back to step S53. If it is "dss" the file discrimination signal is detected in step S56.

In step S57, it is determined whether the file discrimination signal is "dss" or not. If the file discrimination signal is not "dss" the process goes back to step S53. If it is "dss" the file number is detected in step S58.

In Step S59, it is determined whether the file number is not within the range from 0001 to 9999 or not. If the file number is not within the range, the process returns to step S53. If the file number is within the range, in step S60, the file number is set to the voice file information table, and the process goes back to step S53.

Figure 14:
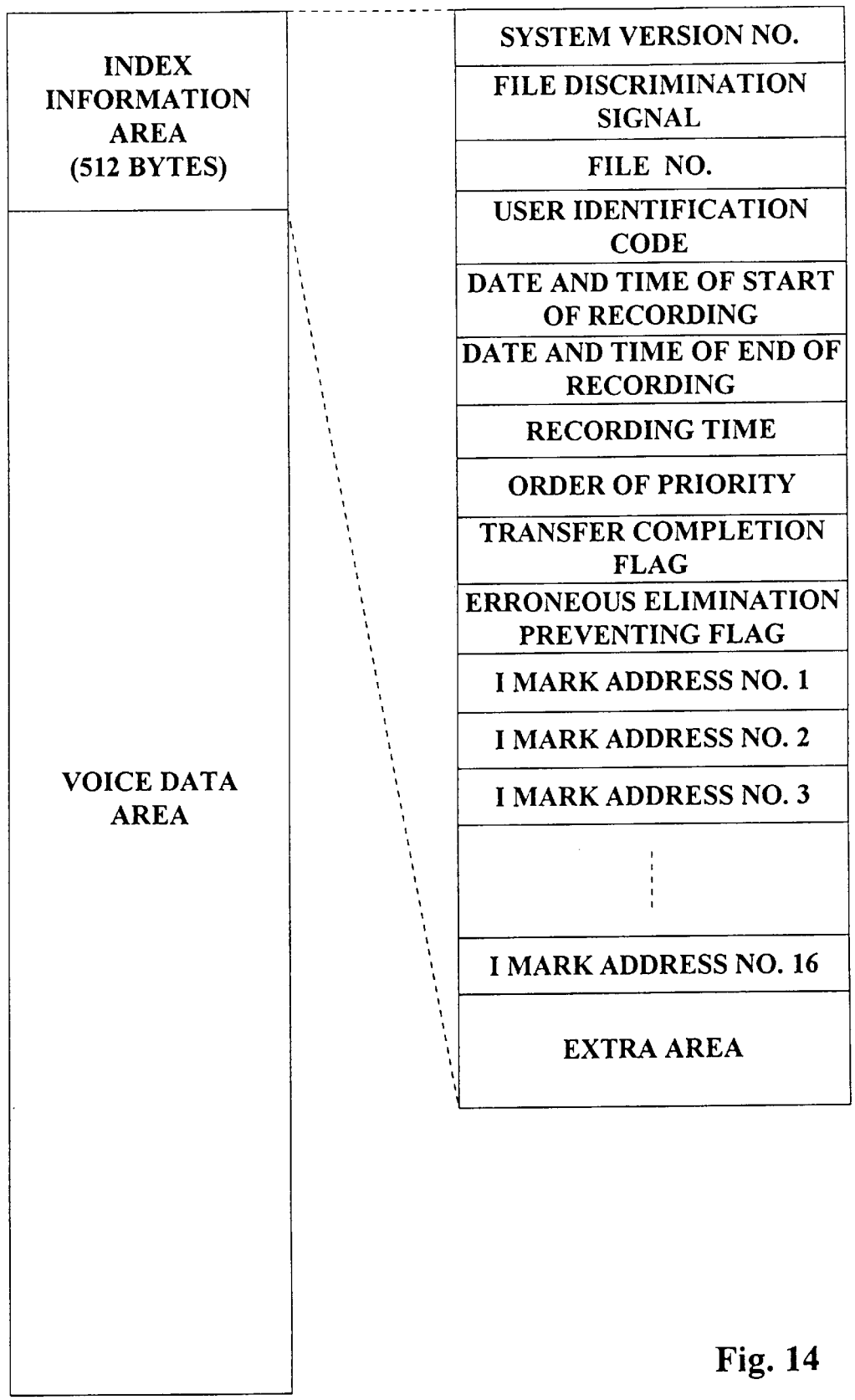
FIG. 14 is a conceptual illustration of the structure of a voice file in the voice recording and reproducing apparatus of the second embodiment of the present invention.

Referring to FIG. 14, information recorded in the index information area will now be described. FIG. 14 is a conceptual illustration of information recorded in the flash memory card 38.

As shown in FIG. 14, the recording area of the flash memory card 38 is divided into an index information area having a storage capacity of, for example, 512 bytes, and a voice data area for recording voice data.

The index information area is further divided into areas for recording a system version number, a file discrimination number, a file number, a user identification code, a date and time of the start of recording, a date and time of the end of recording, recording time, an order of priority, a transfer completion flag, an erroneous elimination preventing flag, I mark addresses Nos. 1–16, an extra area, and the like.

Now, returning to FIG. 12, the operation of the system controller 36 is further descried. After the information on the voice files is displayed on the display 39 in step S35, it is determined in step S36 whether any button in the operating portion 45 has been pressed or not.

If no operating button has been pressed, the process goes back to step S32. If any operating button has been pressed, the process goes to step S37, in which it is determined whether the hold mode setting switch HOLD has been turned on or not.

If the hold mode setting switch HOLD has been turned on, the process goes back to step S32. If it has been turned off, the process goes to step S38, in which it is determined whether the pressed button is the recording button REC or not. If the recording button REC has been pressed, the process goes to step S39, in which a voice recording process is implemented. In the voice recording process, the DSP 35 is controlled to compress the digital signal transmitted from the A/D converter 34, and the compressed digital signal is recorded in the flash memory card 38 via the memory card controller 37.

Figure 15:
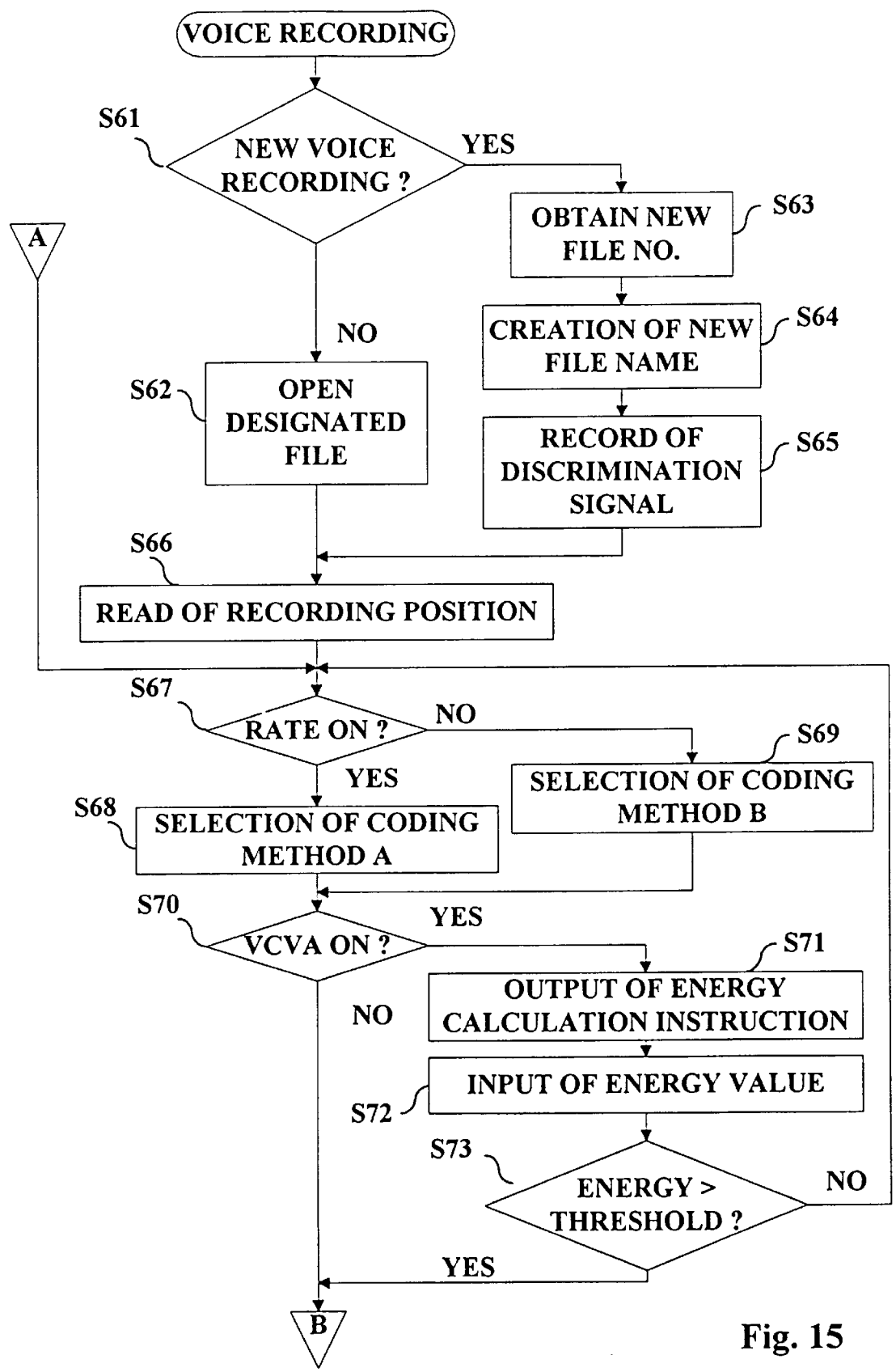
FIG. 15 is a flowchart of a part of a recording process in the voice recording and reproducing apparatus of the second embodiment of the present invention.
Figure 16:
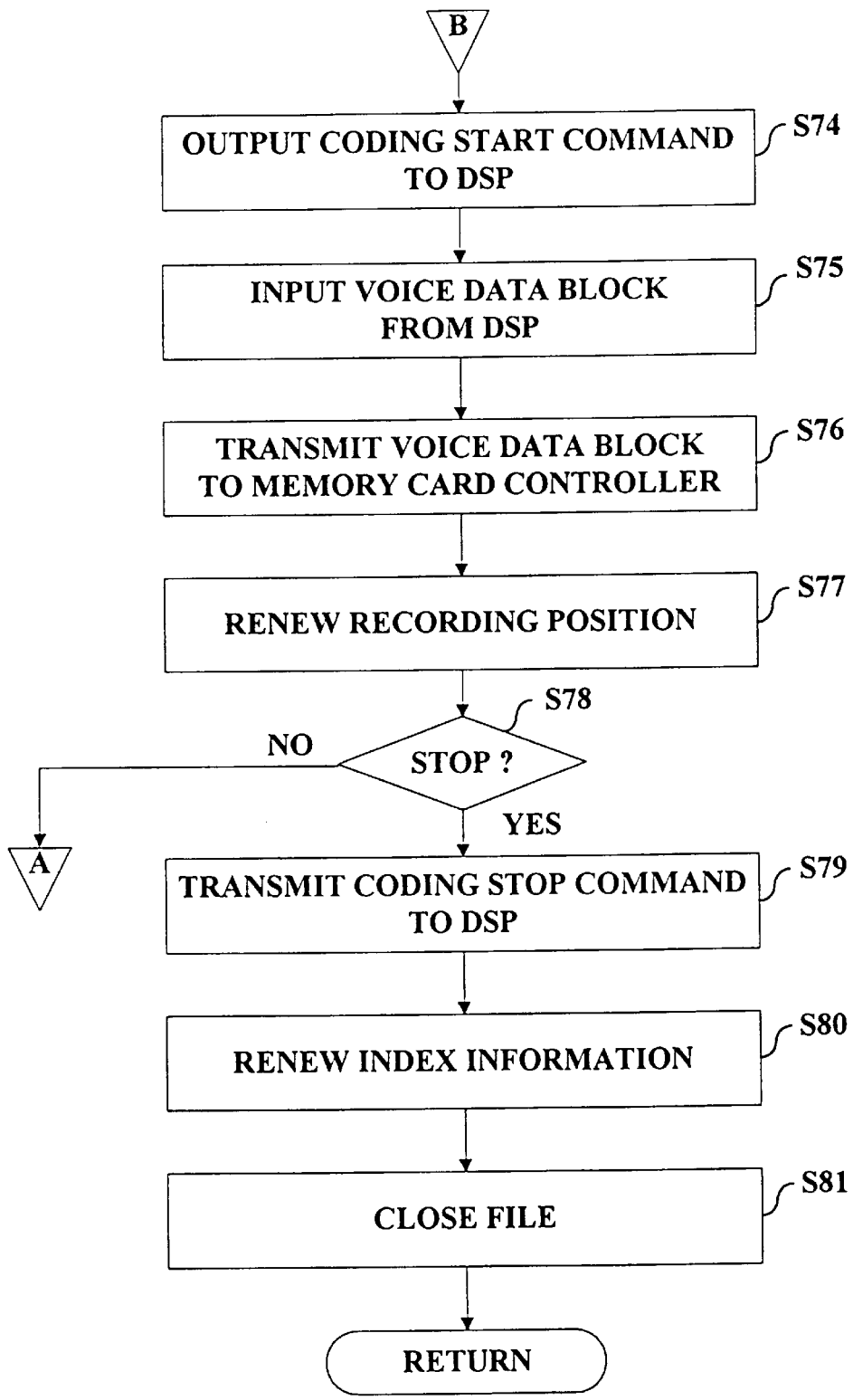
FIG. 16 is a flowchart of the other part of the recording process in the voice recording and reproducing apparatus of the second embodiment of the present invention.

Referring to FIGS. 15 and 16, the details of the voice recording process will now be described. FIG. 15 is a flowchart of a part of the recording process, and FIG. 16 is a flowchart of the other part of the recording process.

When the recording process is started, it is determined in step S61 whether the recording is new or not. If the recording is not new, the designated file is opened in step S62.

If it is determined in step S61 that the recording is new, the process goes to step S63, in which a new file number is obtained from the file information in the flash memory card 38. In step S64, a user identification code and the file number are combined to create a new file name. In step S65, a discrimination signal (dss) is recorded in the index information area.

When the new recording is started and the new file is created, it is a characteristic that a new file number different from any file number recorded in the memory is selected (usually, the file number is sequentially selected from 0001 to 9999) and recorded in a predetermined place in the index information area.

Further, in the present embodiment, since the optional menu can be selected by the menu button MENU to set the user identification code of four characters (usually four Latin alphabets), this user identification code is also recorded in a predetermined place in the index information area of the file.

Then, the file name is created from the user identification code of four characters and the file number of four digits, and the extension of three characters "dss" is added to the file name.

After step S62 or S65 is completed, in step S66, the recording position is read in.. In step S67, it is determined whether the coding mode changing switch RATE has been turned on or not. The coding mode changing switch RATE is to change over two coding methods A and B whose voice data compression methods and bit rates are different from each other.

If the coding mode changing switch RATE has been turned on, the process proceeds to step S68, in which coding method A is selected. Otherwise, in step S69, coding method B is selected.

In step S70, it is determined whether the voice actuated recording mode setting switch VCVA has been turned on or not. If it has been turned on, the process proceeds to step S71, in which an instruction to calculate energy is outputted to the DSP 35.

In step S72, an energy value is inputted from the DSP 35. In step S73, the energy value is compared with a threshold value. If it is equal to or smaller than the threshold value, the process returns to step S67. If the energy value is larger than the threshold value, or if it is determined in step S70 that the voice actuated recording mode setting switch VCVA has been turned off, the process goes to step S74, in which a coding start command is outputted to the DSP 35.

In step S75, a voice data block is inputted. Then, in step S76, the voice data block is transmitted to the memory card controller 37. In step S77, the recording position is renewed. In step S78, it is determined whether the stop button STOP has been operated or not.

If the stop button STOP has not been operated, the process goes back to step S67 and continues the voice recording operation. On the other hand, if the stop button has been operated, a coding stop command is transmitted to the DSP 35 in step S79.

In step S80, the index information is renewed. In step S81, the file is closed to finish the process.

Again, returning to FIG. 12, the operation of the system controller is described. If it is determined in step S38 that the recording button has not been operated, it is determined in step S40 whether the playing button PLAY has been pressed or not. If the playing button PLAY has been pressed, a voice reproducing process is implemented in step S41. In the voice reproducing process, the recorded data in the flash memory card 38 are read out through the memory card controller 37 and transmitted to the DSP 35, in which the data are decompressed and transmitted to the D/A converter 41.

If it is determined in step S40 that the playing button PLAY has not been operated, it is determined in step S42 whether the fast forwarding button FF has been operated or not. If the fast forwarding button FF has been operated, a fast forwarding process is executed in step S43. In the fast forwarding process, the operating position is successively fast forwarded at a proper speed (for example, 100 times faster than that of the voice reproduction).

If it is determined in step S42 that the fast forwarding button FF has not been operated, it is determined in step S44 whether the fast returning button REW has been operated or not. If the fast returning button REW has been pressed, a fast returning process is implemented in step S45. In the fast returning process, the operating position is successively shifted in the opposite direction to and at the same speed as that of the fast forwarding.

If it is determined in step S44 that the fast returning button REW has not been operated, it is determined in step S46 whether the erasing button ERASE has been operated or not. If the erasing button ERASE has been pressed, an erasing process is executed in step S47. In the erasing process, the file corresponding to the file number presently displayed on the display 39 is erased.

If it is determined in S46 that the erasing button ERASE has not been operated, it is determined in step S48 whether the menu button MENU has been operated or not. If the menu button MENU has been pressed, a menu changing process is performed in step S49. In the menu changing process, respective options are set based on the instructions by the up button UP and the down button DOWN.

Specifically, this optional menu is used to set erroneous erasure prevention, microphone sensitivity, a user identification code, an order of priority, a clock or the like. When the up button UP and the down button DOWN are pressed without pressing the menu button MENU, the volume of reproduced voice can be adjusted.

When the stop button STOP is pressed, when the flash memory card 38 is removed, or when the present operating position reaches the ending or starting position of the memory, during the operation of step S39, S41, S43 or S45, then the process exits from these steps and goes back to step S32.

Also when the operation of step S47 or S49 has been completed, or when the menu button MENU has been turned off in step S48, the process goes back to step S32.

According to the second embodiment, even if a flash memory card contains different kinds of files, such as voice files and other files, it is easy to discriminate voice files.

Figure 17:
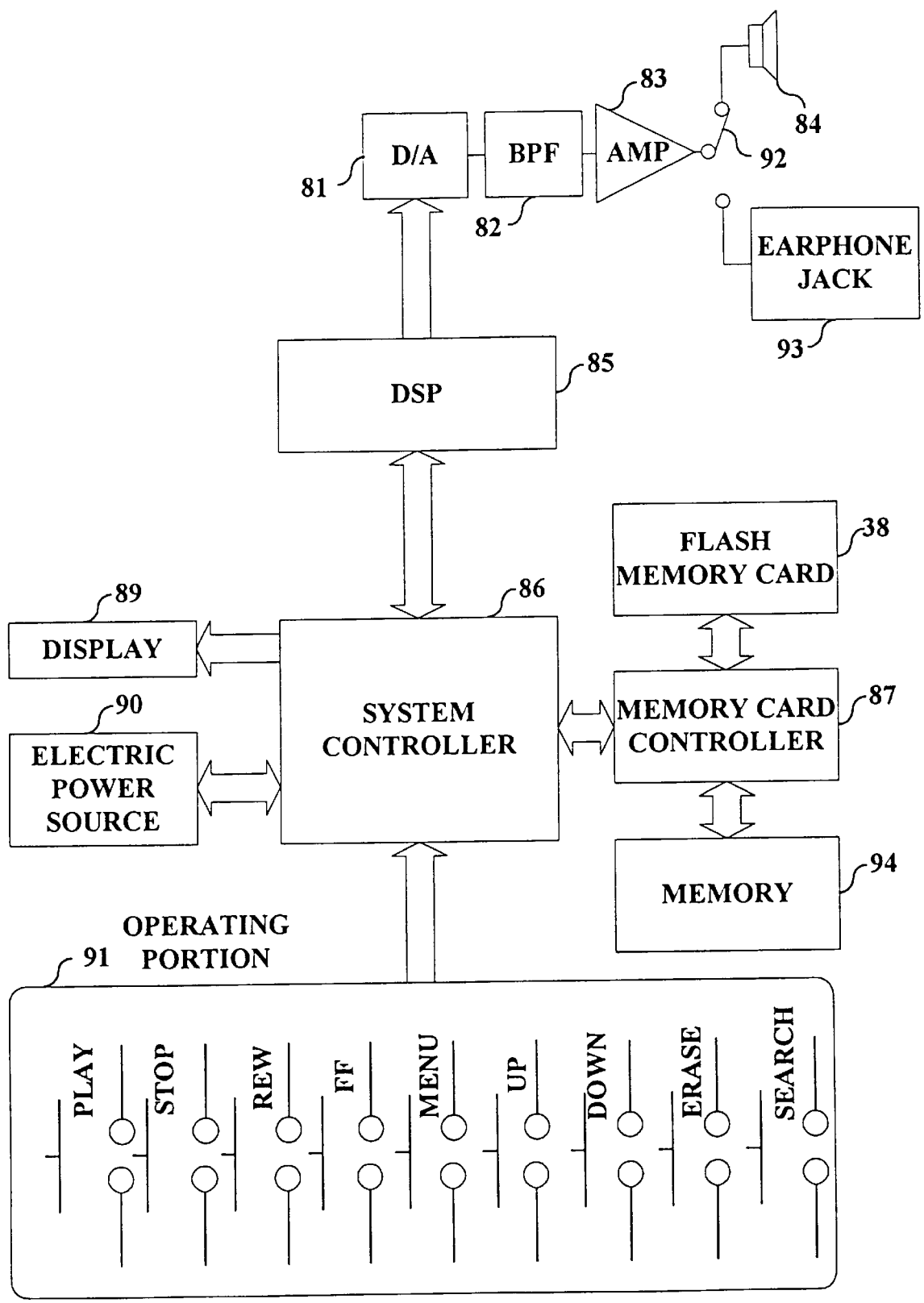
FIG. 17 is a block diagram showing the structure of a voice recording and reproducing apparatus of a third embodiment of the present invention.

Referring to FIGS. 17–20, a third embodiment of the present invention will now be described FIG. 17 is a block diagram of a voice reproducing apparatus of the third embodiment. In the third embodiment, description of the same parts as those of the second embodiment is omitted and different parts will be mainly explained.

The voice reproducing apparatus is designed, for example, as a desk-top type and has a function such that a secretary or a typist can efficiently document a voice file recorded in a flash memory card 38, for example, by the voice recording and reproducing apparatus 51 of the second embodiment The structure of the voice reproducing apparatus is as follows: The flash memory card 38 is detachably coupled to the voice reproducing apparatus. A memory card controller 87 is coupled to the flash memory card 38 for controlling the flash memory card 38 in response to a proper address signal supplied by a system controller 86. A memory 94 is incorporated in the voice reproducing apparatus and functions as a storage medium for storing only an voice file transmitted from the flash memory card 38 through the memory card controller 87 under the control of the system controller 86. In response to the operations of below-mentioned operating buttons and switches, the system controller 86 performs the control of the whole system including the control of the operations of a DSP 35, the memory card controller 87, the flash memory card 38, and the incorporated memory 94. The system controller 86 is an element of a file selecting means, an index information reading means, and a file identification detecting means, a file transfer means, and a file erasing means. The DSP 85 functions as a data decompression means for decompressing data in the voice file transmitted from the incorporated memory 94 under the control of system controller 86 when reproducing. A D/A converter 81 converts to an analog signal the read-out data decompressed by the DSP 85. A band-pass filter 82 cuts off an unnecessary frequency band of the analog signal outputted from the D/A converter 81. An amplifier 83 amplifies the analog signal filtered through the band-pass filter 82. A switch 92 selects a device to which the signal from the amplifier 83 is outputted. A speaker 84 converts to a voice the signal transmitted via the switch 92. An earphone jack 93 outputs the signal from the switch 92 to an earphone or the like. A display 89 displays information, such as an operation mode, a file number or the like, under the control of the system controller 86. An electric power source 90 supplies electric power to the voice reproducing apparatus under the control of the system controller 86. An operating portion 91 is coupled to the system controller 86.

The operating portion 91 comprises a playing button PLAY for starting the voice reproducing; a stop button STOP for stopping the voice reproducing; a fast returning button REW for returning the position of the voice reproducing; a fast forwarding button FF for fast forwarding the position of the voice reproducing; a menu button MENU for selecting an optional function in a menu; an up button UP; a down button DOWN; an erasing button ERASE for erasing recorded voice data; and an index search button SEARCH for searching an index mark for indicating the beginning of a dictation file.

Examples of optional functions selected by the menu button MENU are to set a reproducing speed, a returning amount in auto-backspacing, a tone of reproduced voice, whether to delete a file after transmission of the file, a typist identification code, and a clock. When the up button UP or the down button DOWN is operated without pressing the menu button MENU, the volume of reproduced voice is adjusted.

For example, a RAM, a flash memory, a magnetic disc (e.g., a hard disc) may be adopted as the incorporated memory 94.

Figure 18:
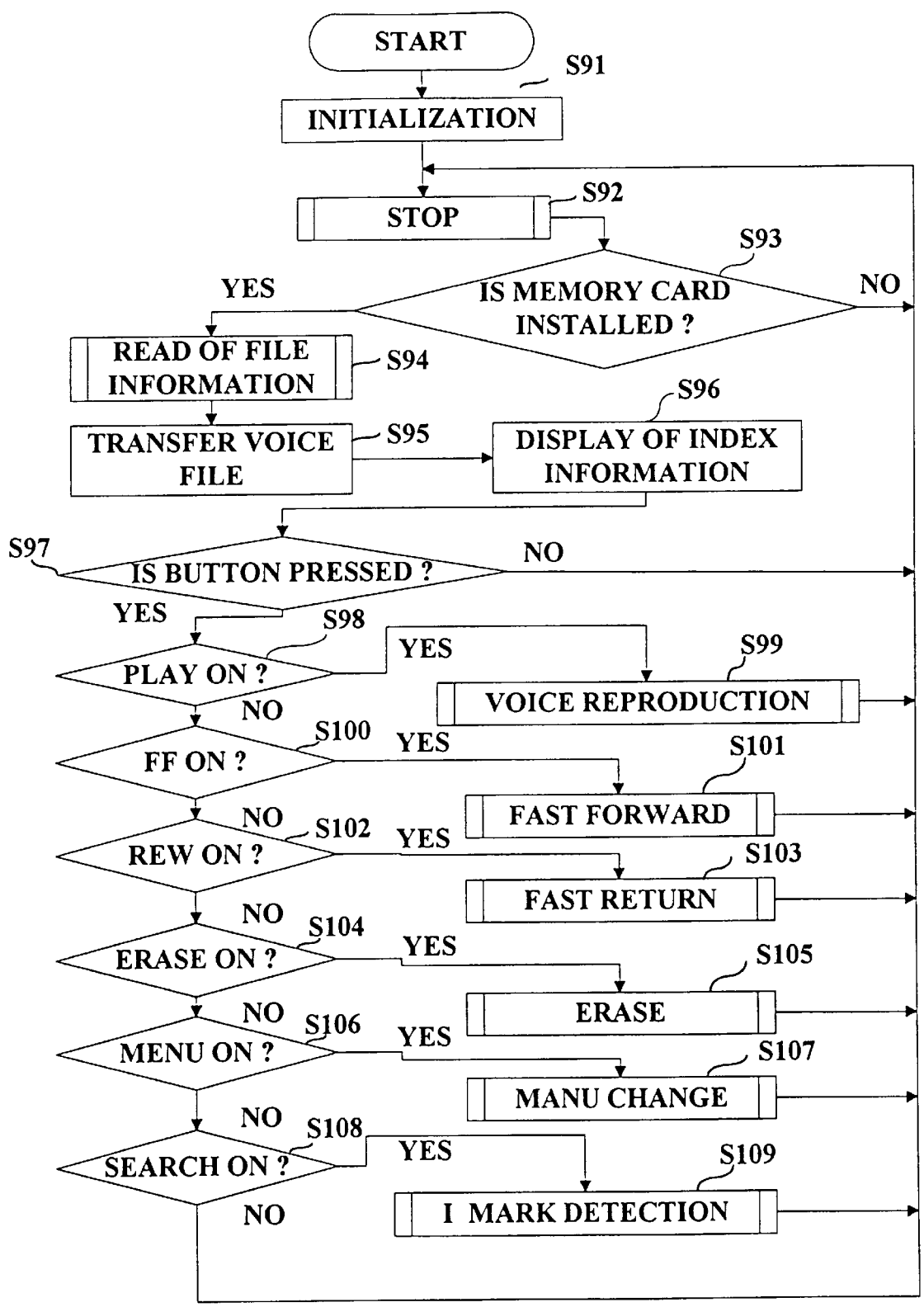
FIG. 18 is a flowchart of an operation of a system controller of the voice recording and reproducing apparatus of the third embodiment of the present invention.

FIG. 18 is a flowchart of an operation of the system controller 86.

When the electric power is supplied from the electric power source 90 to the system controller 86, the system controller starts its operation. In step S91, external conditions and an internal memory of the system controller 86 are initialized and the completion of the initialization is displayed on the display 89.

After the initialization is completed, the operation of the voice reproducing apparatus is stopped in step S92. In step S93, it is determined whether the flash memory card 38 has been installed or not.

If the flash memory card 38 has not been installed, the process goes back to step S92. If the flash memory card 38 has been installed, the process goes to step S94, in which the file information recorded therein is read out. In step S95, an voice file is transferred. In step S96, index information of the file is displayed on the display 89. At this time, the flash memory card 38 may be removed so that the flash memory card 38 can be used for next recording without waiting until the documentation is completed.

Next, in step S97, it is determined whether any operating button has been pressed or not. If no operating button has been pressed, the process goes back to step S92. If an operating button has been pressed, the process goes to step S98, in which it is determined whether the playing button PLAY has been turned on or not.

If the playing button PLAY has been pressed, a voice reproducing process is implemented in step S99. In the voice reproducing process, the recorded data in the flash memory card 38 coupled to the memory card controller 87 are read out and transmitted to the DSP 85, in which the data are decompressed and transmitted to the D/A converter 81.

If it is determined in step S98 that the playing button PLAY has not been operated, it is determined in step S100 whether the fast forwarding button FF has been operated or not. If the fast forwarding button FF has been operated, a fast forwarding process is executed in step S101. In the fast forwarding process, the operating position is successively fast forwarded at a proper speed (for example, 100 times faster than that of the voice reproduction).

If it is determined in step S100 that the fast forwarding button FF has not been operated, it is determined in step S102 whether the fast returning button REW has been operated or not. If the fast returning button REW has been pressed, a fast returning process is implemented in step S103. In the fast returning process, the operating position is successively shifted in the opposite direction to and at the same speed as that of the fast forwarding.

If it is determined in step S102 that the fast returning button REW has not been operated, it is determined in step S104 whether the erasing button ERASE has been operated or not. If the erasing button ERASE has been pressed, an erasing process is executed in step S105. In the erasing process, the file corresponding to the file number presently displayed on the display 89 is erased.

If it is determined in S104 that the erasing button ERASE has not been operated, it is determined in step S106 whether the menu button MENU has been operated or not. If the menu button MENU has been pressed, a menu changing process is performed in step S107. In the menu changing process, respective options are set based on the instructions by the up button UP and the down button DOWN of the operating portion 91.

If it is determined in step S106 that the menu button MENU has not been operated, it is determined in step S108 whether the index search button SEARCH has been operated or not. If the index search button SEARCH has been pressed, an I mark detecting process for detecting an index mark is implemented in step S109.

When the stop button STOP is pressed, or when the present operating position reaches the ending or starting position of the memory, during the operation of step S99, S101 or S103, then the process exits from these steps and goes back to step S92. Since the voice data have already been transmitted to the incorporated memory 94, the flash memory card 38 can be removed at any time.

Also when the operation of step S105, S107 or S109 has been completed, or when the index search button SEARCH has been turned off in step S108, the process goes back to step S102.

Figure 19:
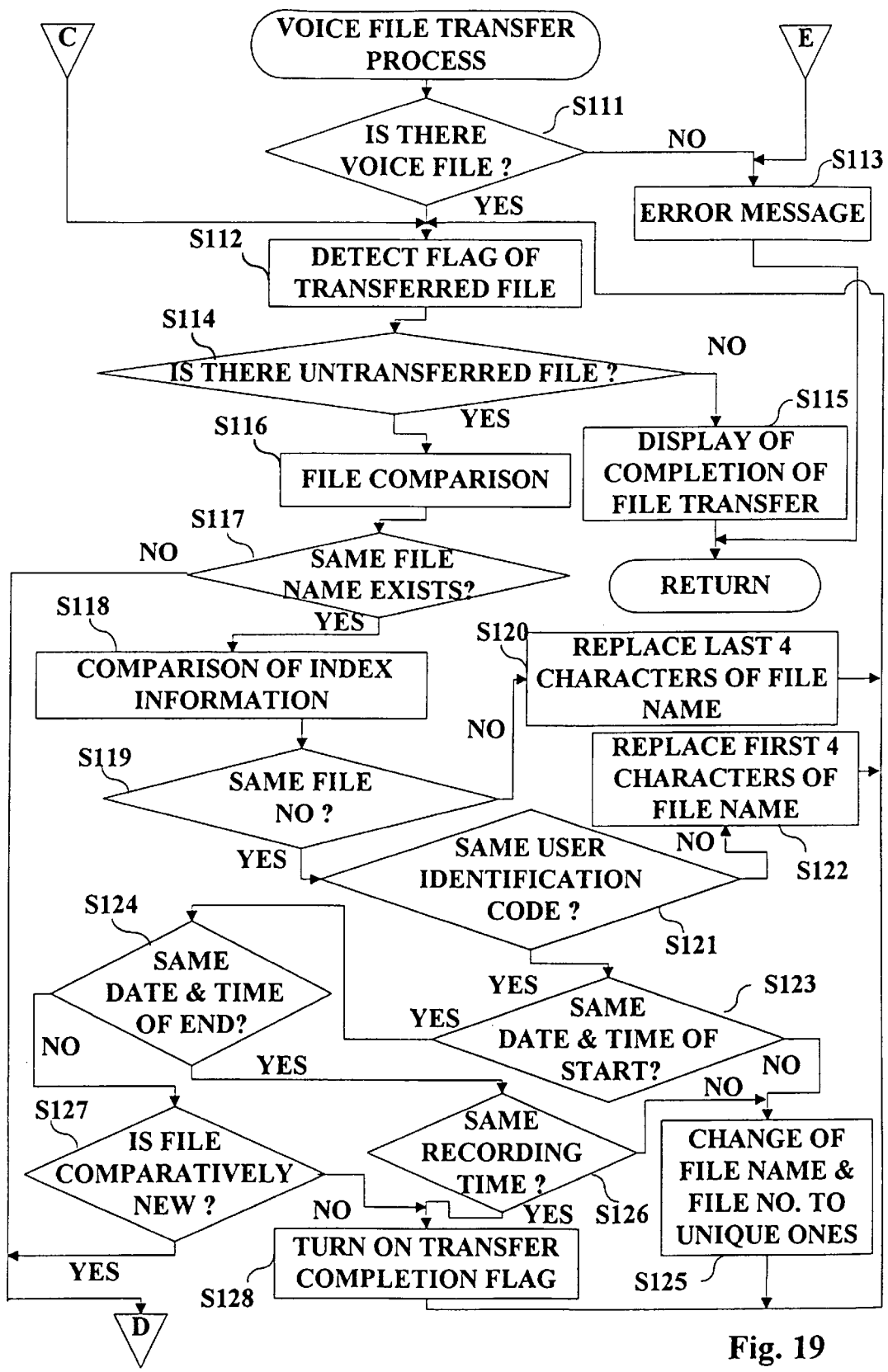
FIG. 19 is a flowchart of a part of a voice file transfer process in the voice recording and reproducing apparatus of the third embodiment of the present invention.
Figure 20:
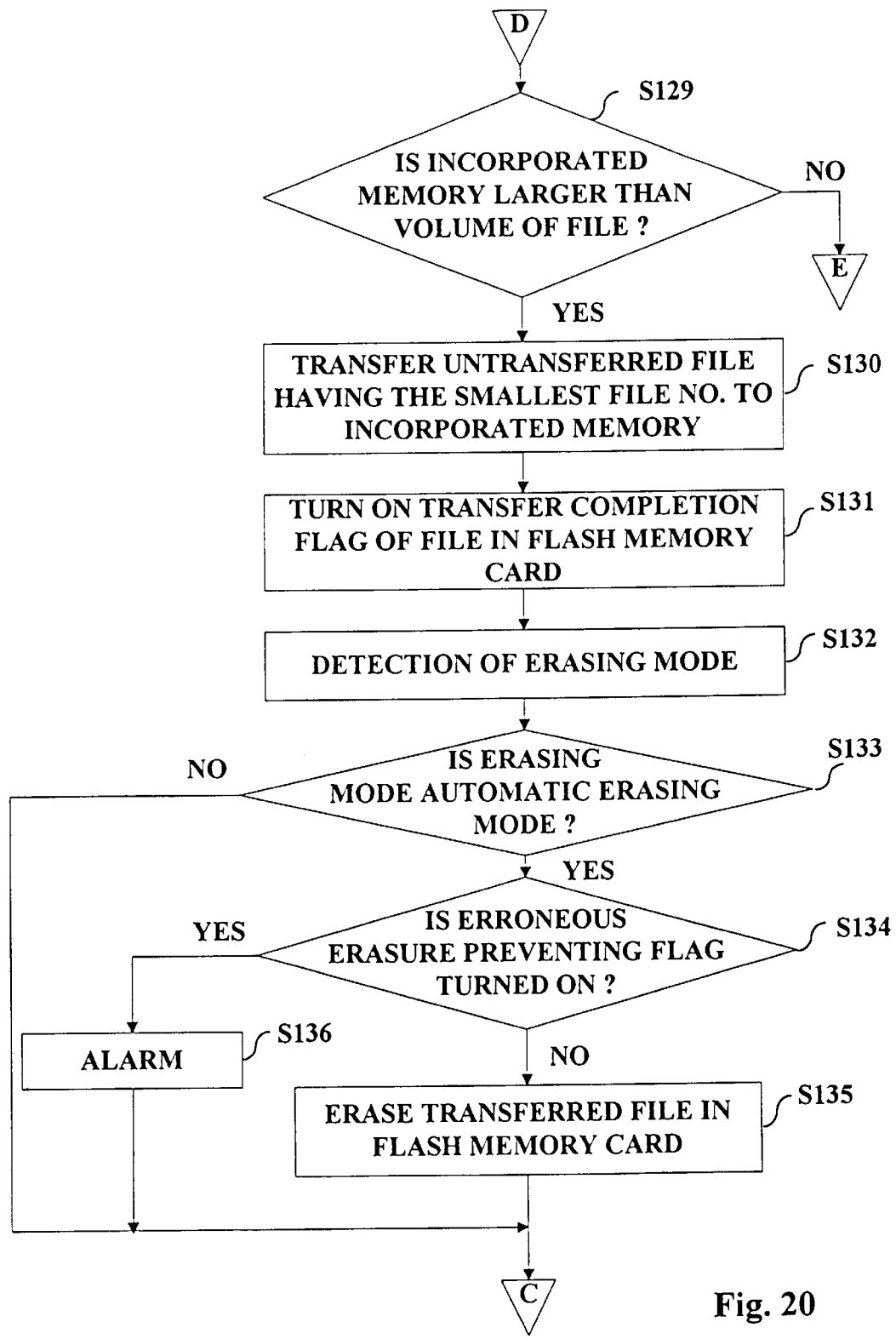
FIG. 20 is a flowchart of the other part of the voice file transfer process in the voice recording and reproducing apparatus of the third embodiment of the present invention.

Referring to FIGS. 19 and 20, the details of the voice file transfer process is described. FIG. 19 is a flowchart of a part of the voice file transfer process, and FIG. 20 is a flowchart of another part of the voice file transfer process.

In step S111, it is determined whether any voice file has been recorded in the detachable flash memory card 38 coupled to the memory card controller 87. If no voice file has been recorded, an error message is displayed on the display 89 in step S113 to exit from the voice file transfer process.

If it is determined in step S111 that a voice file has been recorded, the process proceeds to step S112, in which the index information of the file is read out to detect a flag indicating whether the file has already been transferred. In step S114, based on the flag, it is determined whether there is any file which has not been transferred. If there is no file which has not been transferred, the process goes to step S115, in which the display 89 displays the message that the file transfer has been completed. Then, this file transfer process is quit.

On the other hand, if it is determined in step S114 that there is a file, the process goes to step S116, in which the file is compared with a file or files recorded in the memory 94 incorporated in the voice reproducing apparatus. In step 117, it is determined whether the incorporated memory 94 contains a file having the same file name as that of the file which has not been transferred. If such a file does not exist, the process goes to step S129, in which it is determined whether the incorporated memory 94 has enough space for recording the file. If there is enough space in the memory 94, the file is transferred in step S130. If there is not enough space in the memory 94, the process returns to step S113 to display an error message on the display 89.

If a file having the same file name exists in the incorporated memory 94, contents of the index information of both files are compared to each other in step S118. That is, the file numbers, the user identification codes, the dates and time of the start of recording, the dates and time of the end of recording, and the recording time of both files are compared to each other.

Based on the comparison, it is determined in step S119 whether the file numbers are the same or not. If they are different from each other, the last four characters of the file name of the file in the flash memory card 38 are replaced by its file number in step S120. Then, the process goes back to the step S112.

On the other hand, if the file numbers are the same, it is determined in step S121 whether the user identification codes are the same or not. If they are different from each other, the first four characters of the file name of the file in the flash memory card 38 are replaced by the user identification code in step S122. Then, the process goes back to step S112.

If the user identification codes are the same, it is determined in step S123 whether the dates and time of the start of recording are the same or not. If they are different from each other, the process proceeds to step S125, in which the file name and the file number of the file in the flash memory card 38 are changed to unique ones which have not been used for the files in the incorporated memory 94. Then, the process goes back to step S112.

If the dates and time of the start of recording are the same, it is determined in step S124 whether the dates and time of the end of recording are the same or not. If they are the same, it is determined in step S126 whether the recording time of both files is the same or not.

If the recording time of both files is different from each other, the process proceeds to step S125. If it is the same, the process goes to step S128 to turn on the transfer completion flag of the file in the flash memory card 38. Then, the process goes back to step S112.

If it is determined in step S124 that the dates and time of the end of recording are different from each other, it is determined in step S127 whether the file in the flash memory card 38 is new compared with the file in the incorporated memory 94. If it is not new, the process goes to step S128. If it is new, the process proceeds to step S129, in which it is determined whether the remaining space in the incorporated memory 94 is larger than the volume of the file which has not been transferred.

If it is determined in step S129 that the remaining space is not larger than the volume of the file, the process goes to step S 113. If it is larger than the volume of the file, the untransferred file having the smallest file number is transferred to the incorporated memory 94 in step S130. In step S131, the transfer completion flag of the file in the flash memory card 38 is turned on.

By implementing the comparisons described above, a file in the flash memory card 38 is not transferred if its index information is identical to that of a file in the incorporated memory 94, or if the file in the flash memory card 38 is old compared with the file in the incorporated memory 94 having the same file name. On the other hand, if the index information of both files is different in any item, the file name and the file number of the file in the flash memory card 38 are changed so as to be different from those of the file in the incorporated memory 94 and the file is transferred in accordance with the order of the file numbers. Then, the transfer completion flag recorded in the index information area of the transferred file is turned on.

Next, in step S132, a erasing mode is detected. In step S133, it is determined whether the erasing mode is an automatic erasing mode or not. If it is not the automatic erasing mode, the process goes to step S112. If it is the automatic erasing mode, it is determined in step S134 whether an erroneous erasure preventing flag has been turned on or not.

If the erroneous erasion preventing flag has been turned on, an alarm indicating that the erasion cannot be implemented is outputted in step S136 and the process goes to step S112. On the other hand, if the flag has been turned off, the transferred file in the flash memory card 38 is erased in step S135 and the process goes to step S112.

It can be selected by the optional menu whether the transferred file in the flash memory card 38 is retained or automatically erased after the transfer process is completed. If the automatic erasion after transfer is selected, the same file will not be recorded in duplicate in the separate memories so that the memory space can be saved.

The apparatus of the third embodiment has substantially the same advantage as that of the second embodiment. Further, since the apparatus of the third embodiment can select only the voice files from the flash memory card recording various kinds of files and transfer them to the incorporated memory, an unnecessary file is not transferred to the incorporated memory.

As many apparently widely different embodiments of the present invention may be made without departing from the spirit and scope thereof, it is to be understood that the invention is not limited to the specific embodiments thereof except as defined in the appended claims.

What is claimed is:

1. A voice recording and reproducing apparatus for use with a recording medium, the apparatus comprising:

information storage means for storing predetermined information including at least one of information unique to a user and information unique to the voice recording and reproducing apparatus;

identification code generating means for generating an identification code based on the predetermined information;

analog-to-digital converting means for converting an analog signal representing an input voice to a digital signal;

data compressing means for compressing the digital signal to create voice data;

recording means for recording to the recording medium the voice data and index information of the voice data including the identification code, as a voice file having a name including a predetermined extension consisting of one to three characters;

file reading means for reading out, from the recording medium, only a file having a name including the predetermined extension consisting of one to three characters;

data decompressing means for decompressing the voice data of the file read out by the file reading means;

digital-to-analog converting means for converting the voice data decompressed by the data decompressing means to an analog signal; and detecting means for detecting that the index information of the file read out by the file reading means includes the identification code.

2. The voice recording and reproducing apparatus of claim 1, further comprising means for setting the information unique to the user.

3. The voice recording and reproducing apparatus of claim 1, further comprising file number generating means for generating a unique file number in the recording medium, in which the identification code generating means generates the identification code based on the predetermined information and the file number.

4. The voice recording and reproducing apparatus of claim 3, in which the file number generating means sequentially generates successive file numbers.

5. The voice recording and reproducing apparatus of claim 3, in which the file number generating means sequentially generates random file numbers.

6. The voice recording and reproducing apparatus of claim 1, in which the identification code includes a discrimination signal for indicating that the file is a voice file.

7. The voice recording and reproducing apparatus of claim 1, in which the recording medium is a memory card which can be electrically and mechanically coupled to and removed from the voice recording and reproducing apparatus.

8. A voice recording and reproducing apparatus for use with a recording medium, the apparatus comprising:

information storage means for storing predetermined information including at least one of information unique to a user and information unique to the voice recording and reproducing apparatus;

identification code generating means for generating an identification code based on the predetermined information;

recording means for recording to the recording medium voice data and index information of the voice data including the identification code; and reproducing means for reproducing the recorded voice data.

9. The voice recording and reproducing apparatus of claim 8, further comprising means for setting the information unique to the user.

10. The voice recording and reproducing apparatus of claim 8, further comprising file number generating means for generating a unique file number in the recording medium, in which the identification code generating means generates the identification code based on the predetermined information and the file number.

11. The voice recording and reproducing apparatus of claim 10, in which the file number generating means sequentially generates successive file numbers.

12. The voice recording and reproducing apparatus of claim 10, in which the file number generating means sequentially generates random file numbers.

13. The voice recording and reproducing apparatus of claim 8, in which the recording medium is a memory card which can be electrically and mechanically coupled to and removed from the voice recording and reproducing apparatus.

14. A voice recording apparatus for use with a recording medium, the apparatus comprising:

analog-to-digital converting means for converting an analog signal representing an input voice to a digital signal;

data compressing means for compressing the digital signal to create voice data; and recording means for recording to the recording medium the voice data and index information of the voice data, as a voice file having a name including a predetermined extension consisting of one to three characters.

15. The voice recording apparatus of claim 14, further comprising file number generating means for generating a unique file number in the recording medium, in which the index information includes the file number and a discrimination signal for indicating that the file is a voice file.

16. A voice reproducing apparatus for use with a recording medium, the apparatus comprising:

file reading means for reading out, from the recording medium, only a file having a name including a predetermined extension consisting of one to three characters;

data decompressing means for decompressing digital voice data of the file read out by the file reading means; and digital-to-analog converting means for converting the digital voice data decompressed by the data decompressing means to an analog signal.

17. A voice reproducing apparatus for use with a recording medium, the apparatus comprising:

file reading means for reading out, from the recording medium, only a file having a name including a predetermined extension consisting of one to three characters;

data transfer means for transferring the file read out by the file reading means to the voice reproducing apparatus;

data decompressing means for decompressing digital voice data of the file transferred by the data transfer means; and digital-to-analog converting means for converting the digital voice data decompressed by the data decompressing means to an analog signal.

18. The voice recording apparatus of claim 16, further comprising detecting means for detecting that index information of the file read out by the file reading means includes a file number and a discrimination signal for indicating that the file is a voice file.

19. A voice recording and reproducing apparatus for use with a recording medium, the apparatus comprising:

analog-to-digital converting means for converting an analog signal representing an input voice to a digital signal;

data compressing means for compressing the digital signal to create voice data;

recording means for recording to the recording medium the voice data and index information of the voice data, as a voice file having a name including a predetermined extension consisting of one to three characters;

file reading means for reading out, from the recording medium, only a file having a name including the predetermined extension consisting of one to three characters;

data decompressing means for decompressing the voice data of the file read out by the file reading means; and digital-to-analog converting means for converting the voice data decompressed by the data decompressing means to an analog signal.

20. The voice recording and reproducing apparatus of claim 19, further comprising file number generating means for generating a unique file number in the recording medium, in which the index information includes the file number and a discrimination signal for indicating that the file is a voice file, the voice recording and reproducing apparatus further comprising detecting means for detecting that the index information of the file read out by the file reading means includes the discrimination signal and the file number.

21. A voice recording and reproducing apparatus for use with a recording medium, the apparatus comprising:

an information storage medium for storing predetermined information including at least one of information unique to a user and information unique to the voice recording and reproducing apparatus;

an analog-to-digital converter for converting an analog signal representing an input voice to a digital signal;

a digital signal processor for compressing the digital signal to create voice data and for decompressing the voice data to restore it to the digital signal;

a digital-to-analog converter for converting the digital signal to an analog signal; and a control circuit for generating an identification code based on the predetermined information, for recording to the recording medium the voice data and index information of the voice data including the identification code, as a voice file having a name including a predetermined extension consisting of one to three characters, for reading out, from the recording medium, only a file having a name including the predetermined extension consisting of one to three characters, and for detecting the identification code included in the index information of the read-out file.

22. A voice recording and reproducing apparatus for use with a recording medium, the apparatus comprising:

an information storage medium for storing predetermined information including at least one of information unique to a user and information unique to the voice recording and reproducing apparatus;

a control circuit for generating an identification code based on the predetermined information and for recording, to the recording medium, voice data and index information of the voice data including the identification code; and reproducing means for reproducing the recorded voice data.

23. A voice recording apparatus for use with a recording medium, the apparatus comprising:

an analog-to-digital converter for converting an analog signal representing an input voice to a digital signal;

a digital signal processor for compressing the digital signal to create voice data; and a control circuit for recording to the recording medium the voice data and index information of the voice data, as a voice file having a name including a predetermined extension consisting of one to three characters.

24. A voice reproducing apparatus for use with a recording medium, the apparatus comprising:

a control circuit for reading out, from the recording medium, only a file having a name including a predetermined extension consisting of one to three characters;

a digital signal processor for decompressing digital voice data of the read-out file; and a digital-to-analog converter for converting the decompressed digital voice date to an analog signal.

25. A voice reproducing apparatus for use with a recording medium, the apparatus comprising:

a controller for reading out, from the recording medium, only a file having a name including a predetermined extension consisting of one to three characters and for transferring the read-out file to the voice reproducing apparatus;

a digital signal processor for decompressing digital voice data of the transferred file; and a digital-to-analog converter for converting the decompressed digital voice data to an analog signal.

26. A voice recording and reproducing apparatus for use with a recording medium, the apparatus comprising:

an analog-to-digital converter for converting an analog signal representing an input voice to a digital signal;

a digital signal processor for compressing the digital signal to create voice data and for decompressing the voice data to restore it to the digital signal;

a control circuit for recording to the recording medium the voice data and index information of the voice data, as a voice file having a name including a predetermined extension consisting of one to three characters, and for reading out, from the recording medium, only a file having a name including the predetermined extension consisting of one to three characters; and a digital-to-analog converter for converting the digital signal to an analog signal.

27. A voice recording and reproducing method comprising the steps of:

storing, in a voice recording and reproducing apparatus, predetermined information including at least one of information unique to a user and information unique to the voice recording and reproducing apparatus;

when recording, converting an analog signal representing an input voice to a digital signal; compressing the digital signal to create voice data; generating an identification code based on the predetermined information; adding the identification code to an index of the voice data; creating a voice file having a name including a predetermined extension consisting of one to three characters; and recording the voice file to a recording medium; and when reproducing, reading out, from the recording medium, only a file having a name including the predetermined extension; decompressing the voice data of the read-out file; converting the decompressed voice data to an analog signal; reproducing a voice from the analog signal; and detecting the identification code in the index of the voice file.

28. A voice recording method comprising the steps of:

storing, in a voice recording apparatus, predetermined information including at least one of information unique to a user and information unique to the voice recording apparatus;

converting an analog signal representing an input voice to a digital signal;

compressing the digital signal to create voice data;

generating an identification code based on the predetermined information;

adding the identification code to an index of the voice data;

creating a voice file; and recording the voice file to a recording medium.

29. A voice recording method comprising the steps of:

converting an analog signal representing an input voice to a digital signal;

compressing the digital signal to create voice data;

adding index information to the voice data;

creating a voice file having a name including a predetermined extension consisting of one to three characters; and recording the voice file to a recording medium.

30. A voice reproducing method comprising the steps of:

reading out, from a recording medium, only a file having a name including a predetermined extension consisting of one to three characters;

decompressing digital voice data of the read-out file;

converting the decompressed digital voice data to an analog signal; and reproducing a voice from the analog signal.

31. A voice reproducing method comprising the steps of:

reading out, from a recording medium, only a file having a name including a predetermined extension consisting of one to three characters;

decompressing digital voice data of the read-out file;

converting the decompressed digital voice data to an analog signal; and transmitting the analog signal to a voice reproducing apparatus to reproduce a voice from the analog signal.

32. A voice recording and reproducing method comprising the steps of:

when recording, converting an analog signal representing an input voice to a digital signal; compressing the digital signal to create voice data; adding index information to the voice data; creating a voice file having a name including a predetermined extension consisting of one to three characters; and recording the voice file to a recording medium; and when reproducing, reading out, from the recording medium, only a file having a name including the predetermined extension; decompressing the voice data of the read-out file; converting the decompressed voice data to an analog signal; and reproducing a voice from the analog signal.

33. The voice recording apparatus of claim 14, wherein the index information includes an identification code based on predetermined information including at least one of information unique to a user and information unique to the voice recording apparatus.

34. The voice reproducing apparatus of claim 16, wherein the file is associated with index information that includes an identification code based on predetermined information including at least one of information unique to a user and information unique to the voice reproducing apparatus.

35. The voice reproducing apparatus of claim 17, wherein the file is associated with index information that includes an identification code based on predetermined information including at least one of information unique to a user and information unique to the voice reproducing apparatus.

36. The voice recording and reproducing apparatus of claim 19, wherein the index information includes an identification code based on predetermined information including at least one of information unique to a user and information unique to the voice recording and reproducing apparatus.

37. The voice recording apparatus of claim 23, wherein the index information includes an identification code based on predetermined information including at least one of information unique to a user and information unique to the voice recording apparatus.

38. The voice reproducing apparatus of claim 24, wherein the file is associated with index information that includes an identification code based on predetermined information including at least one of information unique to a user and information unique to the voice reproducing apparatus.

39. The voice reproducing apparatus of claim 25, wherein the file is associated with index information that includes an identification code based on predetermined information including at least one of information unique to a user and information unique to the voice reproducing apparatus.

40. The voice recording and reproducing apparatus of claim 26, wherein the index information includes an identification code based on predetermined information including at least one of information unique to a user and information unique to the voice recording and reproducing apparatus.

41. The voice recording method of claim 29, wherein the index information includes an identification code based on predetermined information including at least one of information unique to a user and information unique to a voice recording apparatus.

42. The voice reproducing method of claim 30, wherein the file is associated with index information that includes an identification code based on predetermined information including at least one of information unique to a user and information unique to a voice reproducing apparatus.

43. The voice reproducing method of claim 31, wherein the file is associated with index information that includes an identification code based on predetermined information including at least one of information unique to a user and information unique to a voice reproducing apparatus.

44. The voice recording and reproducing method of claim 32, wherein the index information includes an identification code based on predetermined information including at least one of information unique to a user and information unique to a voice recording and reproducing apparatus.

45. A voice recording and reproducing apparatus for use with a recording medium, the apparatus comprising:
a memory for storing predetermined information including at least one of information unique to a user and information unique to the voice recording and reproducing apparatus;
a control circuit including a microprocessor for generating an identification code based on the predetermined information;
an analog-to-digital converter for converting an analog signal representing an input signal to a digital signal;
a digital signal processor for compressing the digital signal to create voice data, wherein:
the control circuit records to the recording medium the voice data and index information of the voice data including the identification code, as a voice file having a name including a predetermined extension consisting of one to three characters,
the control circuit reads out, from the recording medium, only a file having a name including the predetermined extension consisting of one to three characters,
the digital signal processor decompresses the voice data of the file read out by the control circuit, and
the control circuit detects that the index information of the file read out by the control circuit includes the identification code; and
a digital-to-analog converter for converting the voice data decompressed by the arrangement for decompressing to an analog signal.

46. A voice recording and reproducing apparatus for use with a recording medium, the apparatus comprising:
information storage means for storing predetermined information including at least one of information unique to a user and information unique to the voice recording and reproducing apparatus;
identification code generating means for generating an identification code based on the predetermined information;
analog-to-digital converting means for converting an analog signal representing an input signal to a digital signal corresponding to voice data;
recording means for recording to the recording medium the voice data and index information of the voice data including the identification code, as a voice file having a name including a predetermined extension;
file reading means for reading out, from the recording medium, only a file having a name including the predetermined extension;
digital-to-analog converting means for converting the digital signal to an analog signal; and
detecting means for detecting that the index information of the file read out by the file reading means includes the identification code.

47. The voice recording and reproducing apparatus of claim 46, further comprising means for setting the information unique to the user.

48. The voice recording and reproducing apparatus of claim 46, further comprising file number generating means for generating a unique file number in the recording medium, in which the identification code generating means generates the identification code based on the predetermined information and the file number.

49. The voice recording and reproducing apparatus of claim 48, in which the file number generating means sequentially generates successive file numbers.

50. The voice recording and reproducing apparatus of claim 48, in which the file number generating means sequentially generates random file numbers.

51. The voice recording and reproducing apparatus of claim 46, in which the identification code includes a discrimination signal for indicating that the file is a voice file.

52. The voice recording and reproducing apparatus of claim 46, in which the recording medium is a memory card which can be electrically and mechanically coupled to and removed from the voice recording and reproducing apparatus.

53. A voice recording and reproducing apparatus for use with a recording medium, the apparatus comprising:
a memory for storing predetermined information including at least one of information unique to a user and information unique to the voice recording and reproducing apparatus;
a control circuit including a microprocessor for generating an identification code based on the predetermined information;
an analog-to-digital converter for converting an analog signal representing an input signal to a digital signal corresponding to voice data, wherein the control circuit:
records to the recording medium the voice data and index information of the voice data including the identification code, as a voice file having a name including a predetermined extension,
reads out, from the recording medium, only a file having a name including the predetermined extension, and
detects that the index information of the file read out by the control circuit includes the identification code; and
a digital-to-analog converter for converting the digital signal to an analog signal.

54. The voice recording and reproducing apparatus of claim 53, further comprising an operation portion including a plurality of buttons for setting the information unique to the user.

55. The voice recording and reproducing apparatus of claim 53, wherein the control circuit generates a unique file number in the recording medium, and wherein the control circuit generates the identification code based on the predetermined information and the file number.

56. The voice recording and reproducing apparatus of claim 53, wherein the control circuit sequentially generates successive file numbers.

57. The voice recording and reproducing apparatus of claim 53, wherein the control circuit sequentially generates random file numbers.

58. The voice recording and reproducing apparatus of claim 53, in which the identification code includes a discrimination signal for indicating that the file is a voice file.

59. The voice recording and reproducing apparatus of claim 53, in which the recording medium is a memory card which can be electrically and mechanically coupled to and removed from the voice recording and reproducing apparatus.

60. A voice recording and reproducing apparatus for use with a recording medium, the apparatus comprising:

an information storage medium for storing predetermined information including at least one of information unique to a user and information unique to the voice recording and reproducing apparatus;

an analog-to-digital converter for converting an analog signal representing an input voice to a digital signal corresponding to voice data;

a digital-to analog converter for converting the digital signal to an analog signal; and a control circuit for generating an identification code based on the predetermined information, for recording to the recording medium the voice data and index information of the voice data including the identification code, as a voice file having a name including a predetermined extension, for reading out, from the recording medium, only a file having a name including the predetermined extension, and for detecting the identification code included in the index information of the file read-out by the control circuit.

61. A voice recording and reproducing method, comprising the steps of:

storing, in a voice recording and reproducing apparatus, predetermined information including at least one of information unique to a user and information unique to the voice recording an reproducing apparatus;

when recording, converting an analog signal representing an input voice to a digital signal corresponding to voice data, generating an identification code based on the predetermined information, adding the identification code to an index of the voice data, creating a voice file having a name including a predetermined extension, and recording the voice file to a recording medium; and when reproducing, reading out, from the recording medium, only a file having a name including the predetermined extension, converting the digital signal to an analog signal, reproducing a voice from the analog signal, and detecting the identification code in the index of the voice file.

62. A voice recording method, comprising the steps of:

storing, in a voice recording apparatus, predetermined information including at least one of information unique to a user and information unique to the voice recording apparatus;

converting an analog signal representing an input voice to a digital signal;

generating an identification code based on the predetermined information;

adding the identification code to an index of the digital signal;

creating a voice file; and recording the voice file to a recording medium.

* * * * *